(12) United States Patent
Nguyen et al.

(10) Patent No.: US 11,501,955 B2
(45) Date of Patent: Nov. 15, 2022

(54) MODULAR HIGH-FREQUENCY SOURCE WITH INTEGRATED GAS DISTRIBUTION

(71) Applicant: Applied Materials, Inc., Santa Clara, CA (US)

(72) Inventors: Hanh Nguyen, San Jose, CA (US); Thai Cheng Chua, Cupertino, CA (US); Philip Allan Kraus, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 104 days.

(21) Appl. No.: 17/164,703

(22) Filed: Feb. 1, 2021

(65) Prior Publication Data

US 2021/0183621 A1   Jun. 17, 2021

Related U.S. Application Data

(62) Division of application No. 15/958,562, filed on Apr. 20, 2018, now Pat. No. 10,943,768.

(51) Int. Cl.
*H01J 37/32* (2006.01)

(52) U.S. Cl.
CPC .... *H01J 37/3244* (2013.01); *H01J 37/32082* (2013.01); *H01J 2237/334* (2013.01); *H01J 2237/335* (2013.01); *H01J 2237/3321* (2013.01)

(58) Field of Classification Search
CPC ............ H01J 37/3244; H01J 37/32082; H01J 2237/3321; H01J 2237/334; H01J 2237/335; H01J 37/3211; C23C 16/455

USPC ..... 118/723 E, 723 ER; 156/345.43, 345.44, 156/345.45, 345.46, 345.47, 345.33, 156/345.34
See application file for complete search history.

(56) References Cited

U.S. PATENT DOCUMENTS

| | | | | |
|---|---|---|---|---|
| 5,380,396 A | * | 1/1995 | Shikida | F04B 43/043 118/728 |
| 5,453,124 A | * | 9/1995 | Moslehi | C23C 16/45561 118/715 |
| 5,643,394 A | * | 7/1997 | Maydan | C23C 16/45574 118/723 E |
| 5,728,223 A | * | 3/1998 | Murakami | C23C 16/455 118/715 |
| 5,741,070 A | * | 4/1998 | Moslehi | B24B 37/013 374/161 |

(Continued)

OTHER PUBLICATIONS

Non-final Office Action from U.S. Appl. No. 15/958,562 dated Apr. 22, 2020, 10 pgs.

(Continued)

*Primary Examiner* — Rudy Zervigon
(74) *Attorney, Agent, or Firm* — Schwabe, Williamson & Wyatt, P.C.

(57) ABSTRACT

Embodiments described herein include an applicator frame for a processing chamber. In an embodiment, the applicator frame comprises a first major surface of the applicator frame and a second major surface of the applicator frame opposite the first major surface. In an embodiment, the applicator frame further comprises a through hole, wherein the through hole extends entirely through the applicator frame. In an embodiment, the applicator frame also comprises a lateral channel embedded in the applicator frame. In an embodiment the lateral channel intersects the through hole.

10 Claims, 15 Drawing Sheets

(56) References Cited

U.S. PATENT DOCUMENTS

| | | | | |
|---|---|---|---|---|
| 5,746,875 A * | 5/1998 | Maydan | C23C 16/45574 | 118/723 E |
| 6,024,799 A * | 2/2000 | Chen | C23C 16/455 | 118/715 |
| 6,245,396 B1 * | 6/2001 | Nogami | C23C 16/4405 | 118/723 ER |
| 6,435,428 B2 * | 8/2002 | Kim | C23C 16/452 | 239/553 |
| 6,468,386 B1 * | 10/2002 | Jeffryes | C23C 16/45565 | 118/723 E |
| 6,886,491 B2 * | 5/2005 | Kim | C23C 16/45514 | 118/723 E |
| 7,252,716 B2 * | 8/2007 | Kim | C23C 16/4558 | 118/715 |
| 7,410,676 B2 * | 8/2008 | Kim | C23C 16/45514 | 117/92 |
| 7,658,800 B2 * | 2/2010 | Chen | C23C 16/45565 | 118/715 |
| 7,712,434 B2 * | 5/2010 | Dhindsa | H01J 37/3244 | 118/723 E |
| 7,712,435 B2 * | 5/2010 | Yoshizaki | H01J 37/32559 | 118/723 E |
| 7,886,687 B2 * | 2/2011 | Lee | H01L 21/67069 | 118/723 E |
| 7,955,986 B2 * | 6/2011 | Hoffman | H01J 37/3266 | 438/714 |
| 8,197,601 B2 * | 6/2012 | Tanaka | C23C 16/4485 | 118/726 |
| 8,211,231 B2 * | 7/2012 | Kerr | C23C 16/45574 | 118/715 |
| 8,277,888 B2 * | 10/2012 | Dedontney | C23C 16/45565 | 427/248.1 |
| 8,293,013 B2 * | 10/2012 | DeDontney | C23C 16/45578 | 118/715 |
| 8,298,370 B2 * | 10/2012 | Byun | C23C 16/45565 | 156/345.34 |
| 8,308,865 B2 * | 11/2012 | Kim | C23C 16/45572 | 118/715 |
| 8,402,845 B2 * | 3/2013 | Dedontney | B01J 19/0046 | 73/865.9 |
| 9,476,121 B2 * | 10/2016 | Byun | C23C 16/45578 | |
| 9,587,312 B2 * | 3/2017 | Silva | C23C 16/45591 | |
| 9,732,424 B2 * | 8/2017 | Lee | H01L 21/68771 | |
| 9,793,126 B2 * | 10/2017 | Dhindsa | H01L 21/67069 | |
| 9,840,777 B2 * | 12/2017 | Zhou | C23C 16/45565 | |
| 9,905,400 B2 * | 2/2018 | Stowell | H01J 37/32192 | |
| 9,982,343 B2 * | 5/2018 | Kao | C23C 16/45574 | |
| 10,130,958 B2 * | 11/2018 | Tam | C23C 16/45519 | |
| 10,316,409 B2 * | 6/2019 | van Schravendijk | C23C 16/45544 | |
| 10,403,476 B2 * | 9/2019 | Gregor | C23C 16/45565 | |
| 10,465,288 B2 * | 11/2019 | Mishra | H01J 37/3244 | |
| 10,480,074 B2 * | 11/2019 | Zhou | C23C 16/45574 | |
| 10,541,145 B2 * | 1/2020 | Ogawa | H01L 21/31116 | |
| 10,615,007 B2 * | 4/2020 | Stowell | H01J 37/32119 | |
| 2001/0042512 A1 * | 11/2001 | Xu | C23C 16/455 | 118/723 R |
| 2003/0209323 A1 * | 11/2003 | Yokogaki | C23C 16/45565 | 156/345.34 |
| 2004/0040503 A1 * | 3/2004 | Basceri | C23C 16/45574 | 118/715 |
| 2004/0049503 A1 | 3/2004 | Basceri et al. | | |
| 2005/0092248 A1 * | 5/2005 | Lee | C23C 16/45565 | 118/715 |
| 2005/0217582 A1 * | 10/2005 | Kim | C23C 16/4557 | 118/723 E |
| 2006/0102286 A1 * | 5/2006 | Kim | C23C 16/507 | 156/345.35 |
| 2006/0263522 A1 * | 11/2006 | Byun | C23C 16/45565 | 427/248.1 |
| 2007/0209686 A1 * | 9/2007 | Bae | H01J 37/3244 | 134/94.1 |
| 2007/0272154 A1 * | 11/2007 | Amikura | C23C 16/45565 | 118/719 |
| 2009/0095221 A1 * | 4/2009 | Tam | C23C 16/34 | 118/715 |
| 2009/0169744 A1 * | 7/2009 | Byun | C23C 16/45514 | 427/255.28 |
| 2009/0178616 A1 * | 7/2009 | Byun | C23C 16/45574 | 118/715 |
| 2009/0179085 A1 * | 7/2009 | Carducci | C23C 16/4557 | 239/289 |
| 2010/0006033 A1 * | 1/2010 | Tanaka | C23C 16/4485 | 118/726 |
| 2010/0255667 A1 * | 10/2010 | Seino | H01L 21/28194 | 438/585 |
| 2011/0073038 A1 * | 3/2011 | Chien | C23C 16/45574 | 118/715 |
| 2011/0256315 A1 * | 10/2011 | Tam | C23C 16/52 | 427/255.28 |
| 2012/0067971 A1 * | 3/2012 | Byun | C23C 16/45591 | 239/106 |
| 2012/0225564 A1 * | 9/2012 | Adachi | H01L 21/02579 | 438/758 |
| 2012/0234945 A1 * | 9/2012 | Olgado | C23C 16/45572 | 239/589 |
| 2012/0247673 A1 * | 10/2012 | Hayashi | C23C 16/503 | 156/345.33 |
| 2013/0174783 A1 * | 7/2013 | Suzuki | C23C 16/45565 | 118/725 |
| 2013/0298835 A1 * | 11/2013 | Tam | C30B 25/14 | 118/728 |
| 2014/0027060 A1 * | 1/2014 | Ranish | G01J 5/0818 | 156/345.33 |
| 2014/0099794 A1 * | 4/2014 | Ingle | H01L 21/3065 | 438/710 |
| 2014/0116338 A1 * | 5/2014 | He | C23C 14/083 | 118/723 E |
| 2014/0165911 A1 * | 6/2014 | Kao | H01J 37/32532 | 118/723 E |
| 2014/0165912 A1 * | 6/2014 | Kao | H01J 37/32357 | 118/723 R |
| 2014/0179114 A1 * | 6/2014 | van Schravendijk | C23C 16/45544 | 438/758 |
| 2014/0283746 A1 * | 9/2014 | Seo | H01J 37/32495 | 118/723 R |
| 2015/0000594 A1 * | 1/2015 | Byun | C23C 16/45514 | 118/715 |
| 2015/0004313 A1 * | 1/2015 | Byun | C23C 16/40 | 427/248.1 |
| 2015/0009594 A1 | 1/2015 | Byun et al. | | |
| 2015/0020848 A1 * | 1/2015 | Kim | H01L 21/0209 | 134/1.2 |
| 2015/0329966 A1 * | 11/2015 | Shah | H01L 21/67115 | 118/730 |
| 2015/0348755 A1 * | 12/2015 | Han | H01J 37/3244 | 118/723 IR |
| 2016/0111256 A1 * | 4/2016 | Stowell | H01J 37/3244 | 156/345.33 |
| 2016/0184838 A1 * | 6/2016 | Byun | C23C 16/45574 | 239/548 |
| 2016/0343565 A1 * | 11/2016 | Seino | H01L 21/02049 | |
| 2017/0133202 A1 | 5/2017 | Berry, III | | |
| 2018/0166258 A1 * | 6/2018 | Kim | H01J 37/32467 | |
| 2018/0182599 A1 * | 6/2018 | Stowell | H01J 37/3244 | |
| 2018/0218883 A1 | 8/2018 | Iwao | | |
| 2018/0286696 A1 * | 10/2018 | Ogawa | H01J 37/32458 | |

OTHER PUBLICATIONS

Final Office Action from U.S. Appl. No. 15/958,562 dated Jun. 23, 2020, 8 pgs.

\* cited by examiner

MODULAR HIGH-FREQUENCY SOURCE WITH INTEGRATED GAS DISTRIBUTION

CROSS-REFERENCE TO RELATED APPLICATIONS

This application is a divisional of U.S. patent application Ser. No. 15/958,562, filed on Apr. 20, 2018, the entire contents of which are hereby incorporated by reference herein.

BACKGROUND

1) Field

Embodiments relate to the field of high-frequency emission sources and, in a particular embodiment, to a modular high-frequency emission source processing tool that includes a gas distribution system integrated into an applicator frame.

2) Description of Related Art

Use of high-frequency radiation systems, including for use in plasma processing, are used extensively in the manufacture of many different technologies, such as those in the semiconductor industry, display technologies, microelectromechanical systems (MEMS), and the like. Currently, radio frequency (RF) radiation systems with a single antenna are most often used. However, in the case of plasmas generated with higher frequencies, including microwave frequencies, a plasma with higher plasma density and/or a plasma with a high concentration of excited neutral species are formed. Unfortunately, high-frequency radiation systems which are generated from a single antenna, for example those used to form plasmas, suffer their own drawbacks.

Typical high-frequency radiation systems, for example those to form a microwave plasma, use a singular, large source of high-frequency or microwave radiation (e.g., a magnetron) and a transmission path for guiding the microwave radiation from the magnetron to the processing chamber. For example, in typical high power microwave applications in the semiconductor industry the transmission path is a microwave waveguide. Waveguides are used because outside of a waveguide designed to carry the specific frequency of the microwave source, the microwave power attenuates rapidly with distance. Additional components, such as tuners, couplers, mode transformers, and the like are also required to transmit the microwave radiation to the processing chamber. These components limit the construction to large systems (i.e., at least as large as the sum of the waveguide and associated components), and severely limit the design. As such, the geometry of the high-frequency radiation field, which may be used to form a plasma, is constrained since the geometry of the high-frequency radiation field resembles the shape of waveguides.

Accordingly, it is difficult to match the geometry of the high-frequency radiation field to the geometry of the substrate that is being processed. In particular, it is difficult to create a high-frequency radiation field at microwave frequencies, either to form a plasma or to expose a substrate to radiation, where the process is uniformly performed on the whole area of the substrate (e.g., 200 mm, 300 mm or larger diameter silicon wafers, glass substrates used in the display industry, or continuous substrates used in roll-to-roll manufacturing, or the like). Some microwave generated plasmas may use a slot line antenna to allow the microwave energy to be spread over an extended surface. However, such systems are complicated, require specific geometry, and are limited in the power density that can be coupled to the plasma.

Furthermore, high-frequency radiation systems typically generate radiation fields and/or plasmas that are not highly uniform and/or are not able to have a spatially tunable density. As the substrates that are being processed continue to increase in size, it becomes increasingly difficult to account for edge effects. Additionally, the inability to tune the radiation field and/or plasma limits the ability to modify processing recipes to account for incoming substrate non-uniformity and adjust the radiation field density and/or plasma density for processing systems in which a nonuniformity is required to compensate for the design of the processing system (e.g., to accommodate the nonuniform radial velocity of the rotating wafers in some processing chambers).

SUMMARY

Embodiments described herein include an applicator frame for a processing chamber. In an embodiment, the applicator frame comprises a first major surface of the applicator frame and a second major surface of the applicator frame opposite the first major surface. In an embodiment, the applicator frame further comprises a through hole, wherein the through hole extends entirely through the applicator frame. In an embodiment, the applicator frame also comprises a lateral channel embedded in the applicator frame. In an embodiment the lateral channel intersects the through hole.

Embodiments described herein comprise a processing tool. In an embodiment, the processing tool comprises a processing chamber, a chuck for supporting a substrate in the processing chamber, an applicator frame forming a portion of the processing chamber. In an embodiment, the applicator frame comprises a first major surface, a second major surface opposite the first major surface, a plurality of through holes, wherein the through holes extend entirely through the applicator frame, and a plurality of lateral channels embedded in the applicator frame, wherein one or more of the lateral channels intersect at least one of the through holes. In an embodiment, the processing tool further comprises a modular high-frequency emission source. The high-frequency source comprises a plurality of high-frequency emission modules, wherein each high-frequency emission module comprises, an oscillator module, an amplification module, where the amplification module is coupled to the oscillator module, and an applicator, where the applicator is coupled to the amplification module, and where the applicator seals one end of one of the through holes in the applicator frame.

Embodiments described herein include a gas distribution assembly. In an embodiment, the gas distribution assembly comprises, an applicator frame and a plurality of applicators. In an embodiment, the applicator frame comprises, a first major surface, a second major surface opposite the first major surface, a plurality of through holes, where the through holes extend entirely through the applicator frame, and a plurality of lateral channels embedded in the applicator frame, where the lateral channels intersect at least one of the through holes. In an embodiment, each applicator seals a first end of one of the plurality of through holes.

The above summary does not include an exhaustive list of all embodiments. It is contemplated that all systems and methods are included that can be practiced from all suitable combinations of the various embodiments summarized above, as well as those disclosed in the Detailed Description below and particularly pointed out in the claims filed with the application. Such combinations have particular advantages not specifically recited in the above summary.

DETAILED DESCRIPTION

Figure 1:
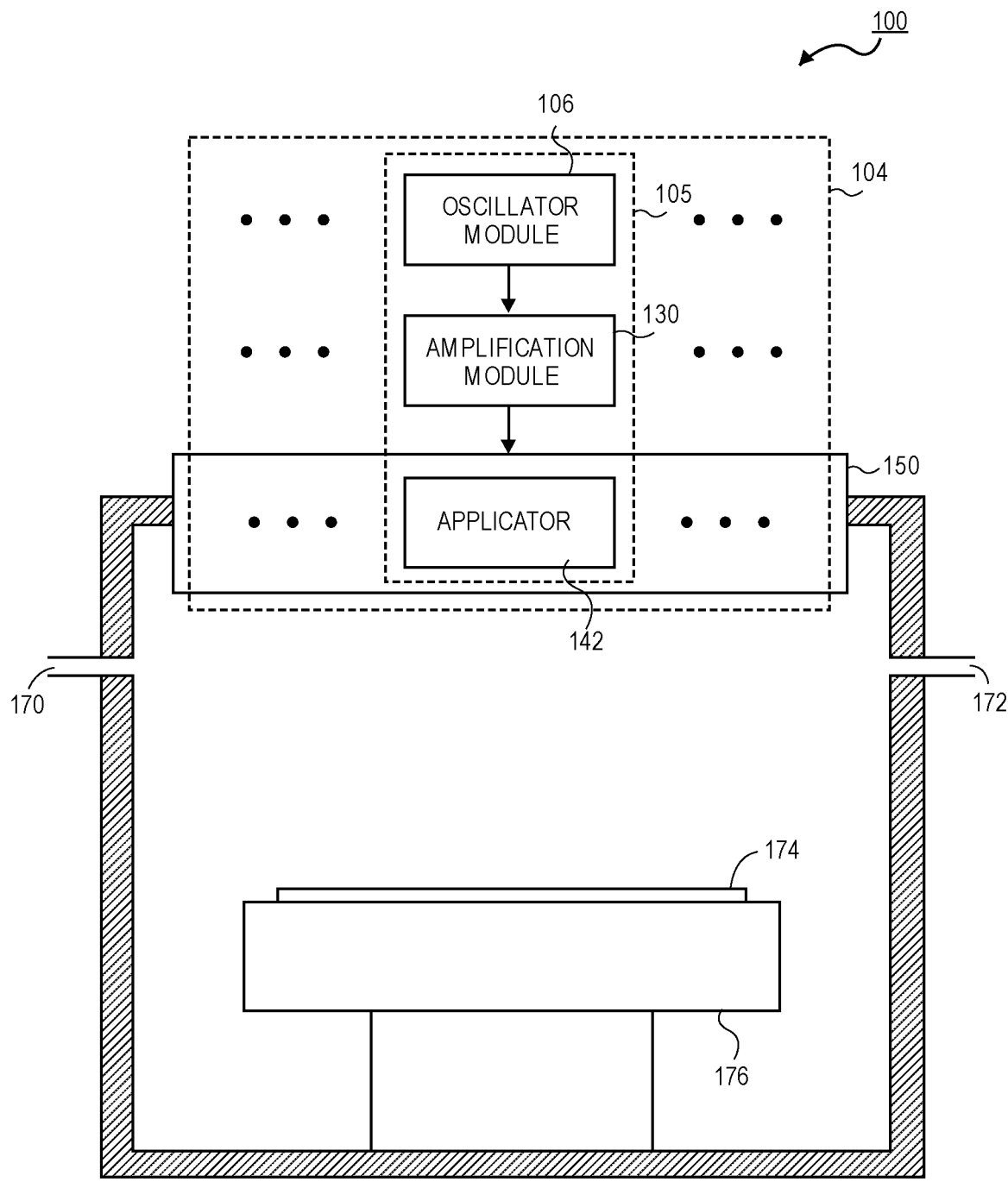
FIG. 1 is a schematic diagram of a processing tool that includes a modular high-frequency emission source, in accordance with an embodiment.

Devices in accordance with embodiments described herein include a modular high-frequency emission source that is used in conjunction with an applicator frame that includes an integrated gas distribution system. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

Embodiments include a modular high-frequency emission source that comprises an array of high-frequency emission modules. According to an embodiment, each high-frequency emission module comprises an oscillator module, an amplification module, and an applicator. In an embodiment, the applicator couples the high-frequency radiation into a processing tool in order to generate radiation field and/or a plasma. The use of a plurality of high-frequency emission modules allows for the applicators to be arranged in different configurations in order to match the needs of a processing tool. In some embodiments, the applicators may be positioned in openings that pass through an applicator frame. In an embodiment, the openings through the applicator frame may be part of an integrated gas distribution system.

Embodiments include a modular high-frequency emission source that comprises an array of high-frequency emission modules. As used herein, "high-frequency" electromagnetic radiation include radio frequency radiation, very-high-frequency radiation, ultra-high-frequency radiation, and microwave radiation. "High-frequency" may refer to frequencies between 0.1 MHz and 300 GHz. According to an embodiment, each high-frequency emission module comprises an oscillator module, an amplification module, and an applicator. In an embodiment, the oscillator module and the amplification module comprise electrical components that are all solid state electronic components.

Proper distribution of gases in a processing chamber is needed in processing chambers. Typically, gases are flown into an upper portion of the chamber and distributed with a gas distribution plate, such as a showerhead. Showerheads include channels for flowing and distributing the gasses over a desired area. The fine channels require precise manufacturing, which results in relatively high costs. Accordingly, embodiments described herein integrate the gas distribution system into the applicator frame that is used to couple the applicators to the processing chamber. In an embodiment, the applicator frame includes a plurality of through holes to house each applicator. The applicator may partially fill the through hole. Lateral channels through the applicator frame may intersect with the openings to provide vertical pathway for the gases to enter the processing chamber. Therefore, additional vertical channels may be omitted in some embodiments. Furthermore, integrating the gas distribution system into the applicator frame allows for embodiments to omit a dedicated gas distribution system typically needed for processing tools.

The use of solid state electronics, instead of for example a magnetron, allows for a significant reduction in the size and the complexity of a high-frequency radiation source. Particularly, the solid state components are much smaller than the magnetron hardware described above. Additionally, the use of solid state components allows for the elimination of bulky waveguides needed to transmit the high-frequency radiation to the processing chamber. Instead, the high-frequency radiation may be transmitted with coaxial cabling. The elimination of waveguides also allows for the construction of a large area modular high-frequency emission source where the size of the plasma formed is not limited by the size of waveguides. Instead, an array of high-frequency emission modules may be constructed in a given pattern that allows for the formation of a plasma that is arbitrarily large (and arbitrarily shaped) to match the shape of any substrate. Furthermore, the cross-sectional shape of the applicators may be chosen so that the array of applicators may be packed together as tightly as possible (i.e., a closed-packed array).

The use of an array of high-frequency emission modules also provides greater flexibility in the ability to locally change the radiation field and/or the plasma density by independently changing the power settings of the amplification module for each high-frequency emission module. This allows for uniformity optimization during radiation field exposure and/or plasma processing, such as adjustments made for wafer edge effects, adjustments made for incoming wafer nonuniformity, and the ability to adjust the radiation field exposure and/or plasma density for processing systems in which a nonuniformity is needed to compensate for the design of the processing system (e.g., to accommodate the nonuniform radial velocity of the rotating wafers in some processing chambers).

Additional embodiments may also include one or more radiation field and/or plasma monitoring sensors. Such embodiments provide a way to measure the density of the plasma, or the electric field strength, or any other plasma property or radiation field property, locally by each applicator, and to use that measurement as part of a feedback loop to control the power applied to each high-frequency emission module. Accordingly, each high-frequency emission module may have independent feedback, or a subset of the high-frequency emission modules in the array may be grouped in zones of control where the feedback loop controls the subset of high-frequency emission modules in the zone.

In addition to the enhanced tuneability of the radiation field and/or the plasma, the use of individual high-frequency emission modules provides a greater power density than are currently available in existing radiation sources and/or plasma sources. For example, high-frequency emission modules may allow for a power density that is approximately five or more times greater than typical RF plasma processing systems. For example, typical power into a plasma enhanced chemical vapor deposition process is approximately 3,000 W, and provides a power density of approximately 4 W/cm$^2$ for a 300 mm diameter wafer. In contrast, high-frequency emission modules according to embodiments may use a 300 W power amplifier with a 4 cm diameter applicator, to provide a power density of approximately 24 W/cm$^2$ at an applicator packing density of approximately 1. At an applicator packing density of ⅓ and with use of a 1000 W power amplifier, a power density of 27 W/cm$^2$ is provided. At an applicator packing density of 1 and with use of a 1000 W power amplifier, a power density of 80 W/cm$^2$ is provided.

Usual approaches for making high-frequency radiation sources and/or plasmas (e.g., microwave plasmas) involve the use of a single oscillator module and a single electrode or applicator to couple the high-frequency energy to the substrate and/or, in the case of forming a plasma, to the process gas. However, using multiple electrode/applicator structures with a single oscillator module that is split to power each of the multiple electrodes/applicators has drawbacks. Particularly, an interference pattern will necessarily form because the electromagnetic radiation generated by single oscillator module results in electromagnetic radiation emitted by each applicator to be at the same frequency and at a fixed phase with each other. The interference pattern produces local maxima and minima that result in a nonuniform radiation field and/or plasma.

Accordingly, embodiments include an array of high-frequency emission modules with each high-frequency emission module having its own oscillator module. When a plurality of oscillator modules are used, the electromagnetic radiation generated by a first oscillator module may not interfere with the electromagnetic radiation generated by a second oscillator module because the first and second oscillator modules may not be at the same frequency nor have a controlled phase difference between the first and second oscillator modules. In embodiments where a plasma is formed, the plasma will have improved uniformity since there is no interference pattern. Similarly, when a plasma is not formed (e.g., microwave heating or microwave curing), interference patterns are avoided and, in an embodiment more uniform heating or curing of the substrate is obtained. In an additional embodiment, a single oscillator module may be shared between two or more (but not all) of the high-frequency emission modules. In such embodiments, the high-frequency emission modules that share the same oscillator module may be referred to as phase locked high-frequency emission modules.

Referring now to FIG. 1, a cross-sectional illustration of a remote plasma processing tool 100 is shown, according to an embodiment. In some embodiments, the processing tool 100 may be a processing tool suitable for any type of processing operation that utilizes a plasma. For example, the processing tool 100 may be a processing tool used for plasma enhanced chemical vapor deposition (PECVD), plasma enhanced atomic layer deposition (PEALD), etch and selective removal processes, and plasma cleaning.

Generally, embodiments include a processing tool 100 that includes a chamber 178. In processing tools 100, the chamber 178 may be a vacuum chamber. A vacuum chamber may include a pump (not shown) for removing gases from the chamber to provide the desired vacuum. Additional embodiments may include a chamber 178 that includes one or more gas lines 170 for providing processing gasses into the chamber 178 and exhaust lines 172 for removing byproducts from the chamber 178. In an additional embodiment, chamber 178 may be a pressure vessel, providing for maintaining a pressure equal to or greater than one atmosphere of pressure. While not shown, it is to be appreciated that the processing tool 100 may include a showerhead for evenly distributing the processing gases over a substrate 174. In some embodiments, the processing tool 100 may optionally not include a chamber, (i.e., the processing tool 100 may be a chamberless processing tool).

In an embodiment, the substrate 174 may be supported on a chuck 176. For example, the chuck 176 may be any suitable chuck, such as an electrostatic chuck. The chuck may also include cooling lines and/or a heater to provide temperature control to the substrate 174 during processing. Due to the modular configuration of the high-frequency emission modules described herein, embodiments allow for the processing tool 100 to accommodate any sized substrate 174. For example, the substrate 174 may be a semiconductor wafer (e.g., 200 mm, 300 mm, 450 mm, or larger). Alternative embodiments also include substrates 174 other than semiconductor wafers. For example, embodiments may include a processing tool 100 configured for processing glass substrates, (e.g., for display technologies).

According to an embodiment, the processing tool 100 includes a modular high-frequency emission source 104. The modular high-frequency emission source 104 may comprise an array of high-frequency emission modules 105. In an embodiment, each high-frequency emission module 105 may include an oscillator module 106, an amplification module 130, and an applicator 142. In an embodiment, the oscillator module 106 and the amplification module 130 may comprise electrical components that are solid state electrical components. In an embodiment, each of the plurality of oscillator modules 106 may be communicatively coupled to different amplification modules 130. In some embodiments, there may be a 1:1 ratio between oscillator modules 106 and amplification modules 130. For example, each oscillator module 106 may be electrically coupled to a single amplification module 130. In an embodiment, the plurality of oscillator modules 106 may generate electromagnetic radiation that is at more than one frequency, and that does not have a controlled phase relationship. Accordingly, the electromagnetic radiation induced in the chamber 178 will not interact in a manner that results in an undesirable interference pattern.

In an embodiment, each oscillator module 106 generates electromagnetic radiation that is transmitted to the amplification module 130. After processing by the amplification module 130, the electromagnetic radiation is transmitted to the applicator 142. According to an embodiment, an array of applicators 142 are coupled to the chamber 178 are positioned over, in, or through an applicator frame 150. In an embodiment, the applicators 142 each function as an antenna for emitting the electromagnetic radiation into the chamber 178. In some embodiments, the applicators 142 couple the electromagnetic radiation to the processing gasses in the chamber 178 to produce a plasma 196.

Figure 2A:
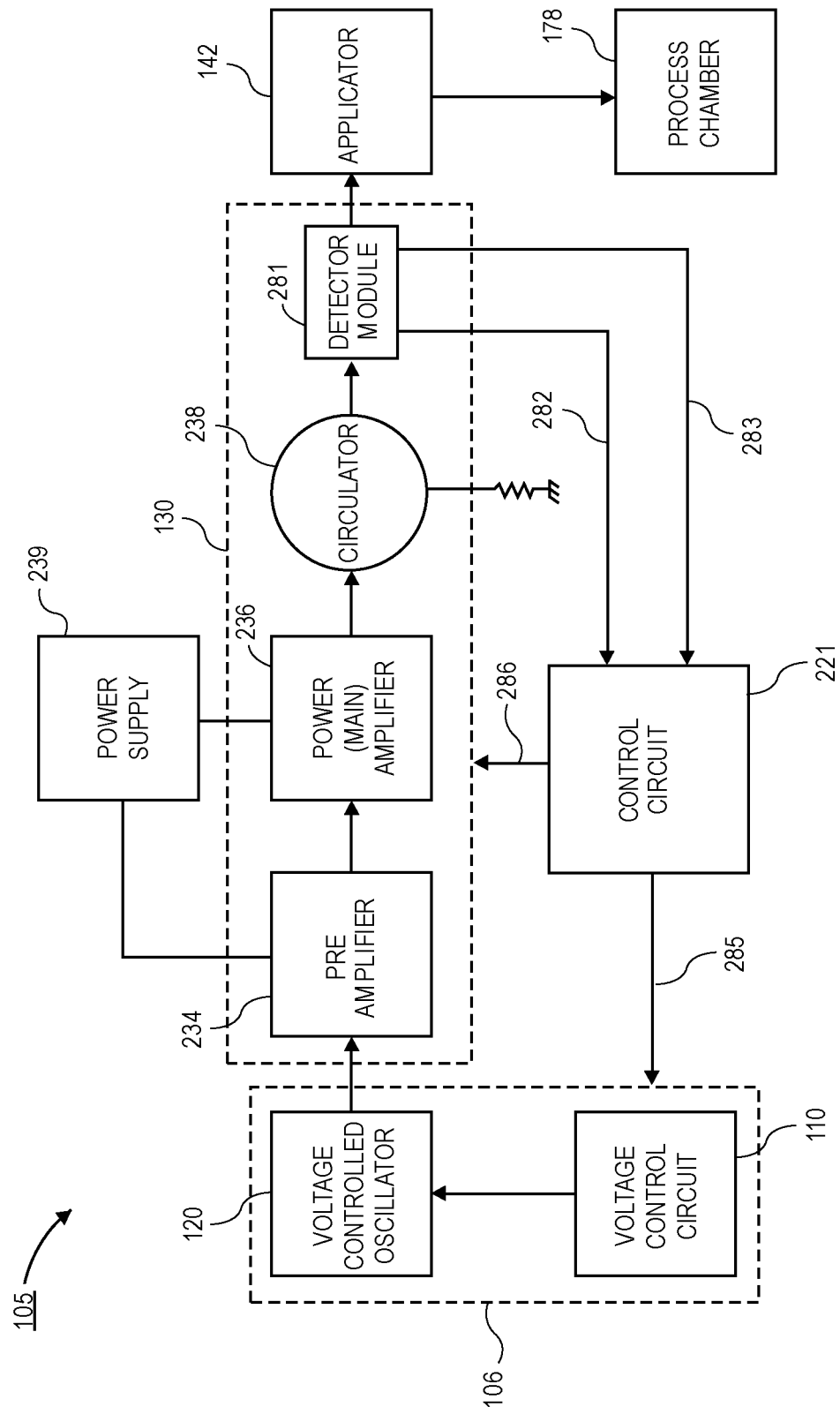
FIG. 2A is a schematic block diagram of a solid state high-frequency emission module with feedback control, in accordance with an embodiment.

Referring now to FIG. 2A, a schematic block diagram of the electronics in a high-frequency emission module 105 in the modular high-frequency emission source 104 is shown, according to an embodiment. In an embodiment, each oscillator module 106 includes a voltage control circuit 210 for providing an input voltage to a voltage controlled oscillator 220 in order to produce high-frequency electromagnetic radiation at a desired frequency. Embodiments may include an input voltage between approximately 1V and 10V DC. The voltage controlled oscillator 220 is an electronic oscillator whose oscillation frequency is controlled by the input voltage. According to an embodiment, the input voltage from the voltage control circuit 210 results in the voltage controlled oscillator 220 oscillating at a desired frequency. In an embodiment, the high-frequency electromagnetic radiation may have a frequency between approximately 0.1 MHz and 30 MHz. In an embodiment, the high-frequency electromagnetic radiation may have a frequency between approximately 30 MHz and 300 MHz. In an embodiment, the high-frequency electromagnetic radiation may have a frequency between approximately 300 MHz and 1 GHz. In an embodiment, the high-frequency electromagnetic radiation may have a frequency between approximately 1 GHz and 300 GHz. In an embodiment, one or more of the plurality of oscillator modules 106 may emit electromagnetic radiation at different frequencies.

According to an embodiment, the electromagnetic radiation is transmitted from the voltage controlled oscillator 120 to the amplification module 130. The amplification module 130 may include a driver/pre-amplifier 234, and a main power amplifier 236 that are each coupled to a power supply 239. According to an embodiment, the amplification module 130 may operate in a pulse mode. For example, the amplification module 130 may have a duty cycle between 1% and 99%. In a more particular embodiment, the amplification module 130 may have a duty cycle between approximately 15% and 50%.

In an embodiment, the electromagnetic radiation may be transmitted to the applicator 142 after being processed by the amplification module 130. However, part of the power transmitted to the applicator 142 may be reflected back due to the mismatch in the output impedance. Accordingly, some embodiments include a detector module 281 that allows for the level of forward power 283 and reflected power 282 to be sensed and fed back to the control circuit module 221. It is to be appreciated that the detector module 281 may be located at one or more different locations in the system. In an embodiment, the control circuit module 221 interprets the forward power 283 and the reflected power 292, and determines the level for the control signal 285 that is communicatively coupled to the oscillator module 106 and the level for the control signal 286 that is communicatively coupled to the amplifier module 130. In an embodiment, control signal 285 adjusts the oscillator module 106 to optimize the high-frequency radiation coupled to the amplification module 130. In an embodiment, control signal 286 adjusts the amplifier module 130 to optimize the output power coupled to the applicator 142. In an embodiment, the feedback control of the oscillator module 106 and the amplification module 130 may allow for the level of the reflected power to be less than approximately 5% of the forward power. In some embodiments, the feedback control of the oscillator module 106 and the amplification module 130 may allow for the level of the reflected power to be less than approximately 2% of the forward power.

Accordingly, embodiments allow for an increased percentage of the forward power to be coupled into the processing chamber 178, and increases the available power coupled to the plasma. Furthermore, impedance tuning using a feedback control is superior to impedance tuning in typical slot-plate antennas. In slot-plate antennas, the impedance tuning involves moving two dielectric slugs formed in the applicator. This involves mechanical motion of two separate components in the applicator, which increases the complexity of the applicator. Furthermore, the mechanical motion may not be as precise as the change in frequency that may be provided by a voltage controlled oscillator 220.

Figure 2B:
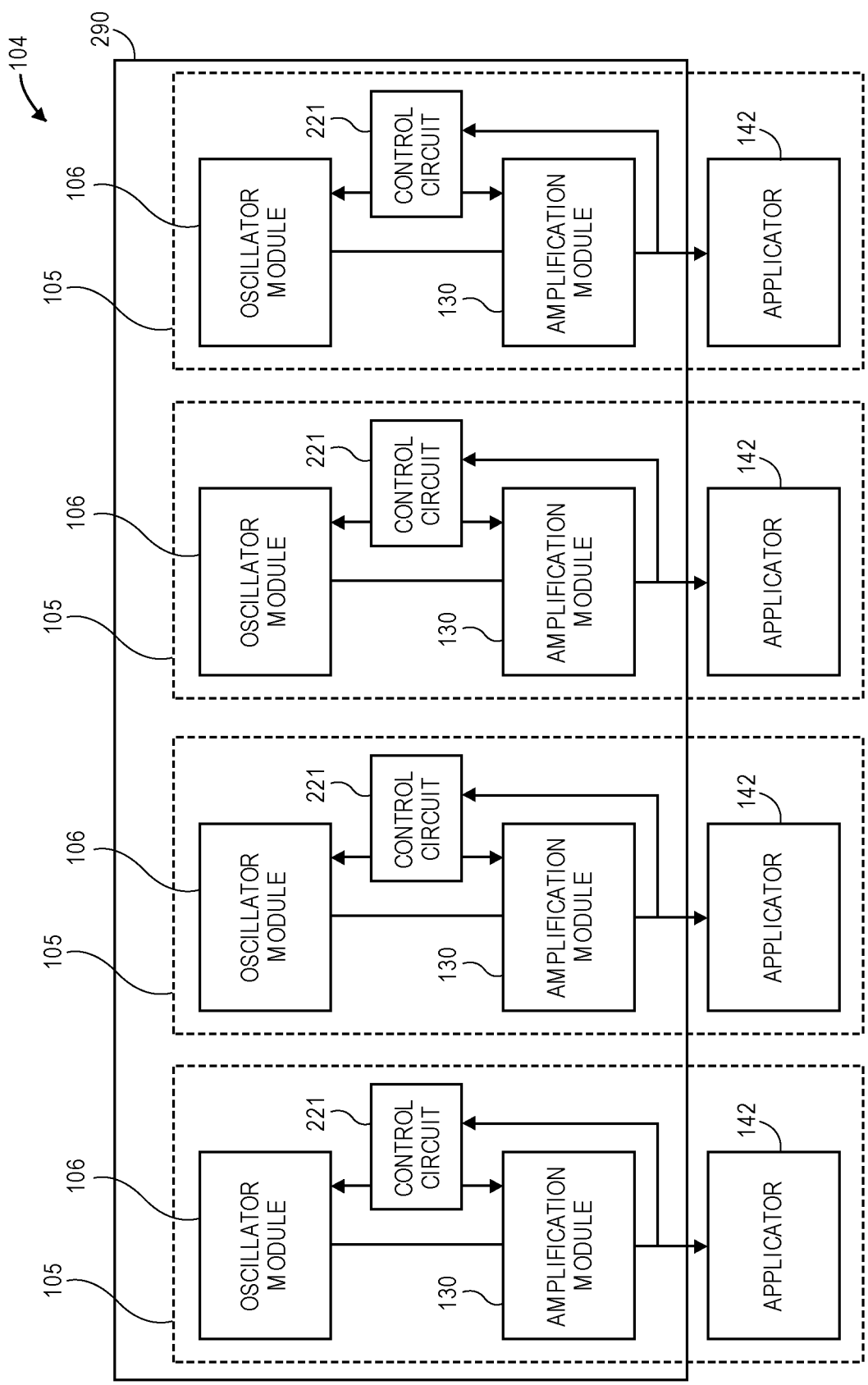
FIG. 2B is a schematic block diagram of a portion of the electronics of a processing tool with a modular high-frequency emission source that includes a plurality of oscillator modules and feedback control, in accordance with an embodiment.

Referring now to FIG. 2B, a schematic of a portion of the solid state electronics of a modular high-frequency emission source 104 with an array of high-frequency emission modules 105 is shown, in accordance with an embodiment. In the illustrated embodiment, each high-frequency emission module 105 includes an oscillator module 106 that is communicatively coupled to a different amplification module 130. Each of the amplification modules 130 may be coupled to different applicators 142. In an embodiment, a control circuit 221 may be communicatively coupled to the oscillator module 106 and the amplification module 130.

In the illustrated embodiment, each of the oscillator modules 106 and the amplification modules 130 are formed on a single board 290, such as a printed circuit board (PCB). However, it is to be appreciated that the oscillator modules 106 and the amplification module 130 may be formed on two or more different boards 290. In the illustrated embodiment four high-frequency emission modules 105 are shown. However, it is to be appreciated that the modular high-frequency emission source 104 may include two or more high-frequency emission modules 105. For example the modular high-frequency emission source 104 may include 2 or more high-frequency emission modules, 5 or more high-frequency emission modules, 10 or more high-frequency emission modules, or 25 or more high-frequency emission modules.

Figure 2C:
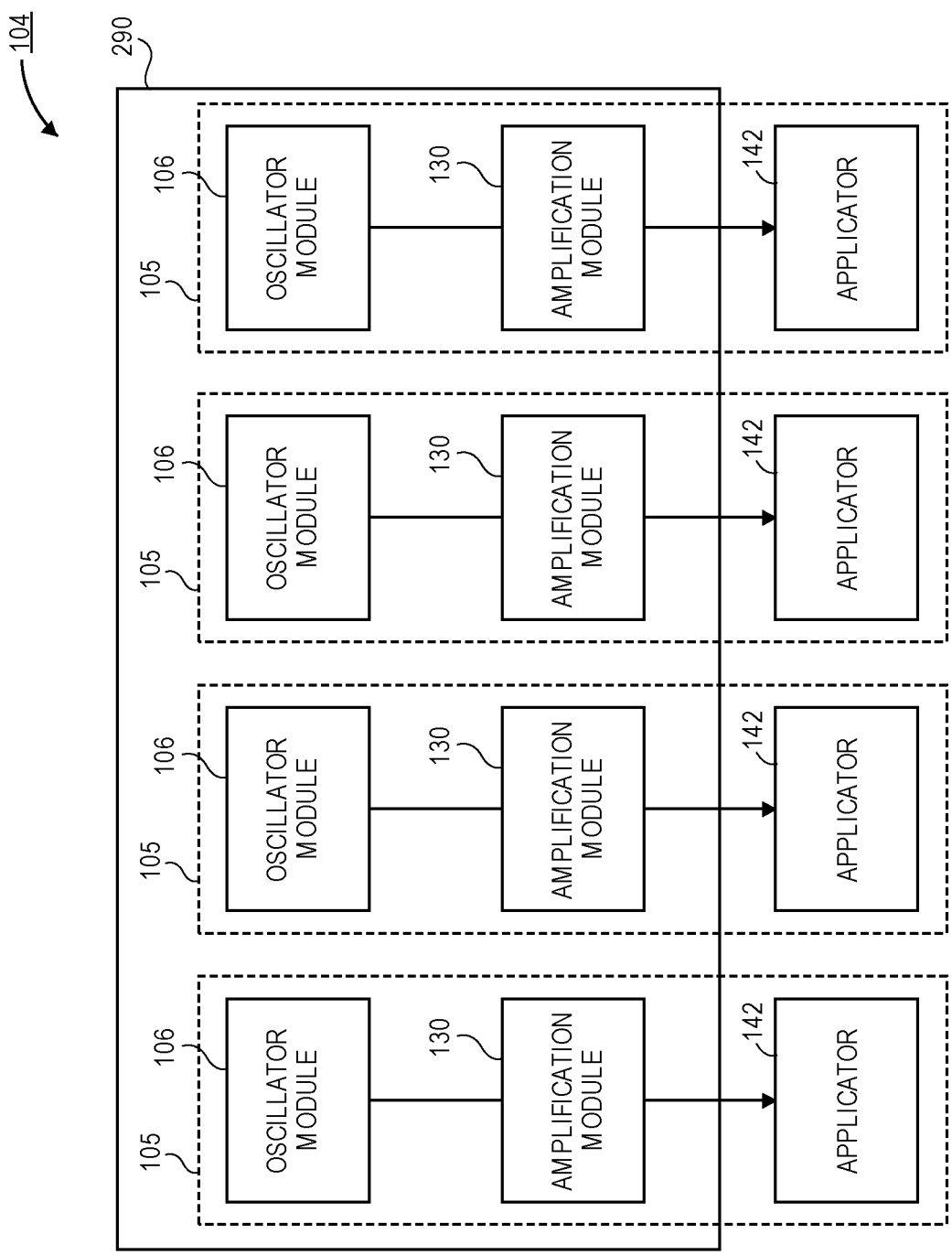
FIG. 2C is a schematic block diagram of a portion of the electronics of a processing tool with a modular high-frequency emission source that includes a plurality of oscillator modules, in accordance with an embodiment.

Referring now to FIG. 2C, a schematic of a portion of the solid state electronics of a modular high-frequency emission source 104 with an array of high-frequency emission modules 105 is shown, in accordance with an embodiment. FIG. 2C is substantially similar to the system illustrated in FIG. 2B, with the exception that the control circuit is omitted. Particularly, in some embodiments the feedback control provided by a detector and the control circuit may not be needed.

Figure 3:
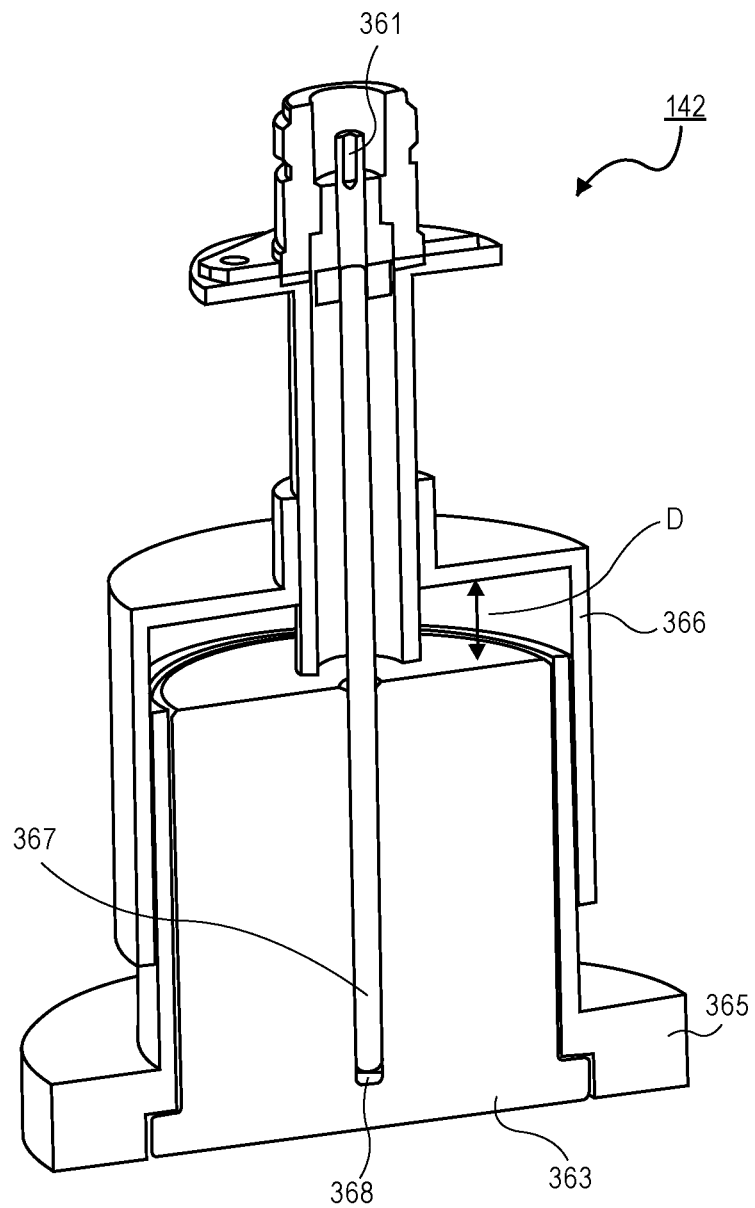
FIG. 3 is cross-sectional illustration of an applicator that may be used to couple high-frequency radiation to a processing chamber, in accordance with an embodiment.

Referring now to FIG. 3, a cut-away illustration of an applicator 142 is shown, according to an embodiment. In an embodiment, the electromagnetic radiation is transmitted to an applicator 142 by a coaxial cable 361 that couples to a monopole 367 that extends axially through the applicator 142. In an embodiment where the electromagnetic radiation is high-frequency radiation, the monopole 367 may also extend into a channel 368 formed into a center of a dielectric resonant cavity 363. The dielectric resonant cavity 363 may be a dielectric material, such as quartz, aluminum oxide, titanium oxide, or the like. Additional embodiments may also include a resonant cavity 363 that does not include a material (i.e., the dielectric resonant cavity 363 may be air or a vacuum). According to an embodiment, the dielectric resonator is dimensioned so that the dielectric resonator supports resonance of the high-frequency radiation. Generally, the size of the dielectric resonant cavity 363 is dependent on the dielectric constant of the material used to form the dielectric resonant cavity 363 and the frequency of the high-frequency radiation. For example, materials with higher dielectric constants would allow for smaller resonant cavities 363 to be formed. In an embodiment where the dielectric resonant cavity 363 includes a circular cross-section, the diameter of the dielectric resonant cavity 363 may be between approximately 1 cm and 15 cm. In an embodiment, the cross-section of the dielectric resonant cavity 363 along a plane perpendicular to the monopole 367 may be any shape, so long as the dielectric resonant cavity 363 is dimensioned to support resonance. In the illustrated embodiment, the cross-section along a plane perpendicular to the monopole 367 is circular, though other shapes may also be used, such as polygons (e.g., triangles, rectangles, etc.), symmetrical polygons (e.g., squares, pentagons, hexagons, etc.), ellipses, or the like).

In an embodiment, the cross-section of the dielectric resonant cavity 363 may not be the same at all planes perpendicular to the monopole 367. For example, the cross-section of a bottom extension proximate to the open end of the applicator housing 365 is wider than the cross-section of the dielectric resonant cavity proximate to the channel 368. In addition to having cross-sections of different dimensions, the dielectric resonant cavity 363 may have cross-sections with different shapes. For example, the portion of the dielectric resonant cavity 363 proximate to the channel 368 may have a circular shaped cross-section, whereas the portion of the dielectric resonant cavity 363 proximate to the open end of the applicator housing 365 may be a symmetrical polygon shape (e.g., pentagon, hexagon, etc.). However, it is to be appreciated that embodiments may also include a dielectric resonant cavity 363 that has a uniform cross-section at all planes perpendicular to the monopole 367.

According to an embodiment, the applicator 142 may also include an impedance tuning backshort 366. The backshort 366 may be a displaceable enclosure that slides over an outer surface of the applicator housing 365. When adjustments to the impedance need to be made, an actuator (not shown) may slide the backshort 366 along the outer surface of the applicator housing 365 to change a distance D between a surface of the backshort 366 and a top surface of the dielectric resonant cavity 363. As such, embodiments provide more than one way to adjust the impedance in the system. According to an embodiment, an impedance tuning backshort 366 may be used in conjunction with the feedback process described above to account for impedance mismatches. Alternatively, the feedback process or an impedance tuning backshort 356 may be used by themselves to adjust for impedance mismatches.

According to an embodiment, the applicator 142 functions as a dielectric antenna that directly couples the high-frequency electromagnetic field into the processing chamber 178. The particular axial arrangement of the monopole 367 entering the dielectric resonant cavity 363 may produce an TM01δ mode excitation. However different modes of excitation may be possible with different applicator arrangements. For example, while an axial arrangement is illustrated in FIG. 3, it is to be appreciated that the monopole 367 may enter the dielectric resonant cavity 363 from other orientations. In one such embodiment, the monopole 367 may enter the dielectric resonant cavity 363 laterally, (i.e., through a sidewall of the dielectric resonant cavity 363).

It is to be appreciated that the applicator 142 illustrated in FIG. 3 is exemplary in nature, and embodiments are not limited to the design described. For example, the applicator 142 in FIG. 3 is particularly suitable for emitting microwave radiation. However, embodiments may include any applicator design that is configured to emit any high-frequency electromagnetic radiation.

Figure 4A:
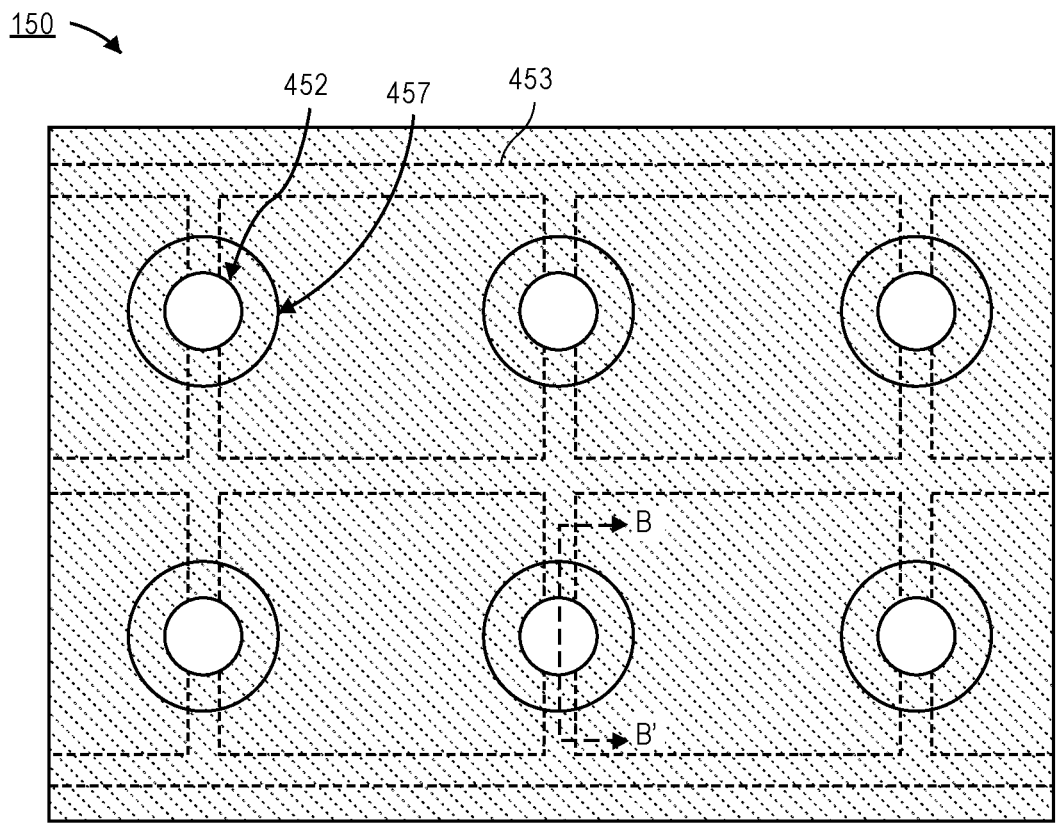
FIG. 4A is a plan view illustration of applicator frame with an integrated gas distribution system, in accordance with an embodiment.

Referring now to FIG. 4A, a plan view illustration of a portion of an applicator frame 150 is shown, in accordance with an embodiment. In an embodiment, the applicator frame 150 may be a monolithic layer or the applicator frame may be a composite of more than one material. For example, the applicator frame may include a conductive material and a dielectric material. In an embodiment, the conductive material may grounded.

In an embodiment, the applicator frame 150 may include a plurality of openings 452 that pass completely through the applicator frame 150. In an embodiment, the openings 452 may each be concentric with a larger diameter recess 451 that is formed into the applicator frame 150, but does not pass entirely through the applicator frame 150. In the illustrated embodiment, the openings 452 and the recesses 451 as being substantially circular. However, it is to be appreciated that the openings 452 and the recesses 451 may be any shaped cross-section, and the cross-sectional shape of the openings 452 and the recesses 451 do not need to match. In an embodiment, the openings 452 and the recesses 451 substantially match the shape of the applicators 142 set into the openings 452 and recesses 451. Furthermore, the openings 452 and recesses 451 may be arranged in any desired pattern. Examples of patterns the openings 452 and recess 451 may be formed in are described in greater detail below with respect to FIGS. 6A-6D.

In an embodiment, a gas distribution system that comprises a plurality of substantially lateral channels 453 is integrated into the applicator frame 150. The lateral channels 453 are indicated with dashed lines in FIG. 4A to indicate that they are embedded within the applicator frame 150. In an embodiment, the lateral channels 453 may be used for distributing one or more gasses through the applicator frame 150. In an embodiment, inlets (not shown) at the edge of the applicator frame 150 fluidically coupled the lateral channels 150 to one or more gas sources.

In an embodiment, gas exits applicator frame 150 at the through holes 452. For example, one or more lateral channels 453 may intersect with a through hole 452. When applicators 142 are set in the through holes 452 the upper portion of the opening is sealed and the gas will exit the applicator frame 150 out the bottom surface of the through hole 452, as will be described in greater detail below. In FIG. 4A, a simplified diagram of the lateral channels 453 is shown. However, it is to be appreciated that the lateral channels 453 may include any number of pathways (e.g., to provide dedicated pathways for any number of different gasses).

Figure 4B:
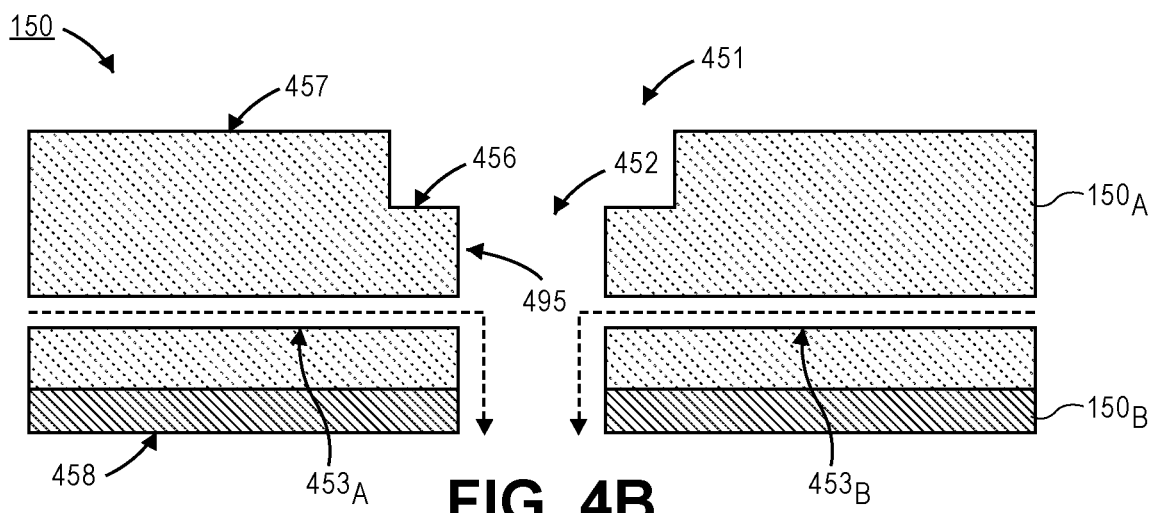
FIG. 4B is a cross-sectional illustration of the applicator frame in FIG. 4A along line B-B', in accordance with an embodiment.

Referring now to FIG. 4B, a cross-sectional illustration of the applicator frame 150 along line B-B' in FIG. 4A is shown, in accordance with an embodiment. In FIG. 4B the applicator frame 150 is illustrated as a composite component that includes a first material layer $150_A$ and a second material layer $150_B$. In an embodiment, the first material layer $150_A$ may be a conductive material and be grounded. In an embodiment the second material layer $150_B$ may be a dielectric material.

In an embodiment, the recess 451 may be formed into a first major surface 457 of the applicator frame and end at a ledge surface 456. In an embodiment, the opening 452 may extend entirely through the applicator frame 150. For example, in the illustrated embodiment, the opening 452 extends from the ledge surface 456 to a second major surface 458. In embodiments that omit the recess 451, the opening may extend from the first major surface 457 to the second major surface 458.

In an embodiment, the first major surface 457 may be outside the chamber 178, and the second major surface 458 may be face the interior of the chamber. For example, when the applicator frame 150 forms a portion of a chamber lid, the first major surface 457 may be the outside portion of the lid and the second major surface 158 may be the inside portion of the lid. Similarly, when the applicator frame 150 forms a portion of a chamber sidewall, the first major surface 457 may be the outside portion of the chamber sidewall and the second major surface 158 may be the inside portion of the chamber sidewall.

In an embodiment one or more lateral channels 453 may intersect with a sidewall 495 of the opening 452. In the illustrated embodiment a first lateral channel $453_A$ and a second lateral channel $453_B$ intersect the opening 452. As such, the channels $453_A$ and $453_B$ may deliver processing gasses that exit the applicator frame 150 at the opening 452, as indicated by the arrows. In an embodiment the first lateral channel $453_A$ and the second lateral channel $453_B$ deliver the same processing gas or gasses to the opening 452. In an additional embodiment, the first lateral channel $453_A$ and the second lateral channel $453_B$ deliver different processing gasses to the opening 452. In an embodiment, the lateral channels $453_A$ and $453_B$ may be formed in one layer of a multi-layer applicator frame 150.

Figure 4C:
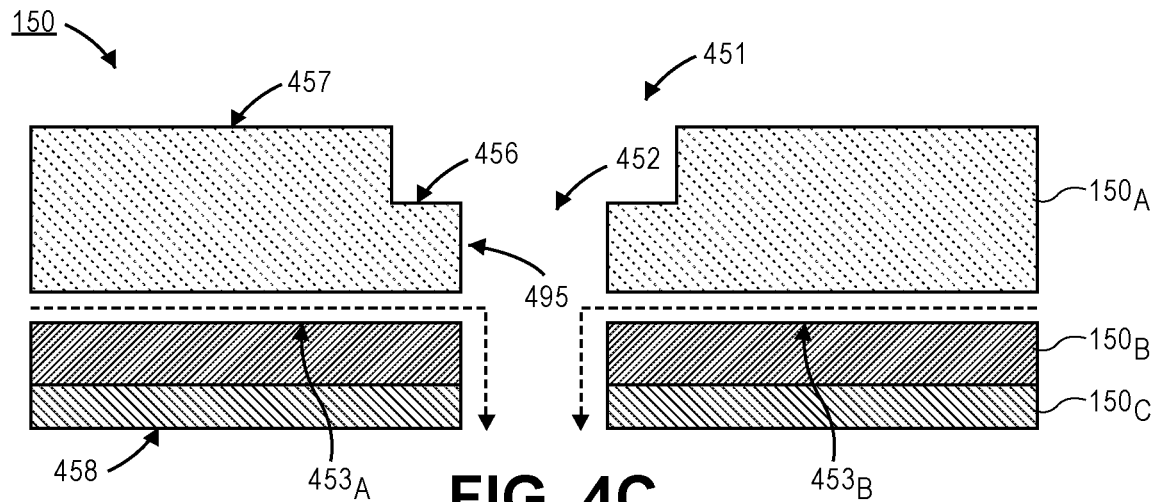
FIG. 4C is a cross-sectional illustration of the applicator frame in FIG. 4A along B-B', in accordance with an additional embodiment.

In an additional embodiment illustrated in FIG. 4C, the lateral channels 453 may be formed at the interface between two material layers of an applicator frame 150. For example, in FIG. 4C, the first and second lateral channels $453_A$ and $453_B$ are formed between a first material layer $150_A$ and a second material layer $150_B$. In an embodiment, the first and second material layers $150_A$ and $150_B$ may be conductive materials, and the third material layer $150_C$ may be a dielectric material. In some embodiments, one of the plurality of material layers $150_{A-C}$ may be a grounded conductor.

Figure 4D:
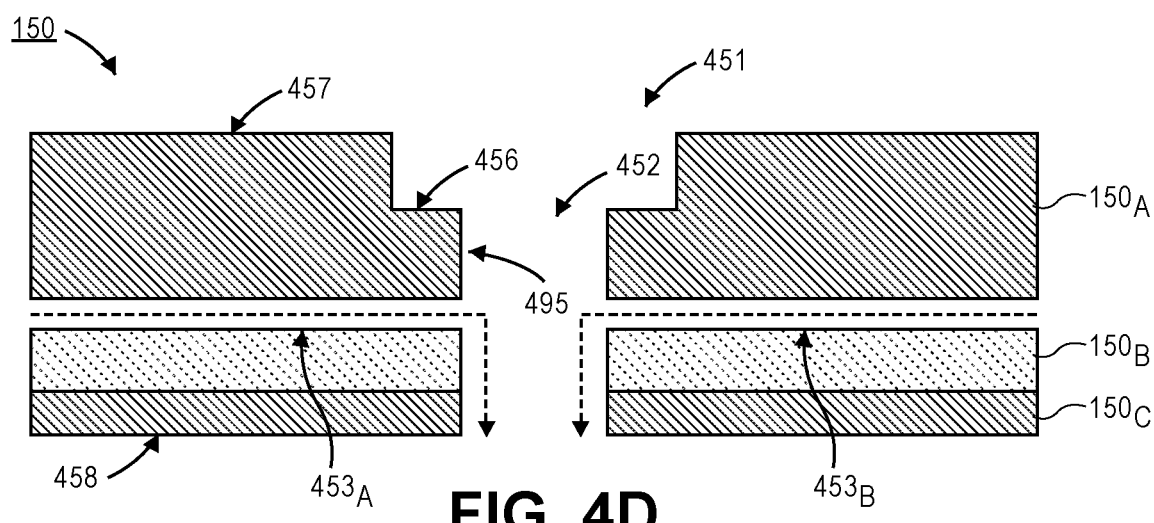
FIG. 4D is a cross-sectional illustration of the applicator frame in FIG. 4A along B-B', in accordance with an additional embodiment.

Referring now to FIG. 4D, a cross-sectional illustration of an applicator frame 150 is shown, in accordance with an additional embodiment. In FIG. 4D, the applicator frame 150 comprises a first dielectric layer $150_A$ and a second dielectric layer $150_C$. In an embodiment, a conductive material layer $150_B$ may be formed between the first dielectric layer $150_A$ and the second dielectric layer $150_C$. In an embodiment, the conductive layer $150_B$ may be grounded. In an embodiment, the grounded conductor may be a conductive mesh, a plate, or any other suitable ground reference.

Figure 4E:
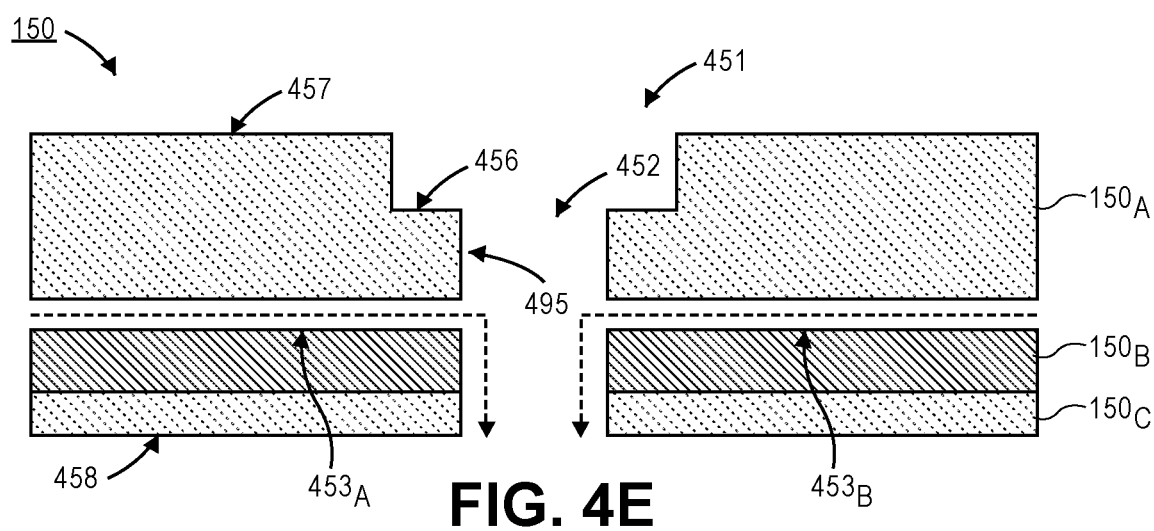
FIG. 4E is a cross-sectional illustration of the applicator frame in FIG. 4A along B-B', in accordance with an additional embodiment.

Referring now to FIG. 4E, a cross-sectional illustration of an applicator frame 150 is shown, in accordance with an additional embodiment. In FIG. 4E, the applicator frame 150 comprises a first conductive layer $150_A$ and a second conductive layer $150_C$. In an embodiment, a dielectric layer $150_C$ may separate the first and second conductive layers $150_A$ and $150_C$.

It is to be appreciated that the applicator frames illustrated in FIGS. 4B-4E are exemplary in nature. For example, the applicator frame 150 may comprise any number of layers and any number of different materials. In an embodiment the applicator frame may comprise a grounded layer and a dielectric layer. In an embodiment, the applicator frame may comprise only a grounded layer. In some embodiments, the applicator frame 150 may comprise one or more of a metal, a semiconductor, a dielectric, or the like. For example, the applicator frame 150 may comprise one or more of aluminum, silicon, and quartz.

Figure 4F:
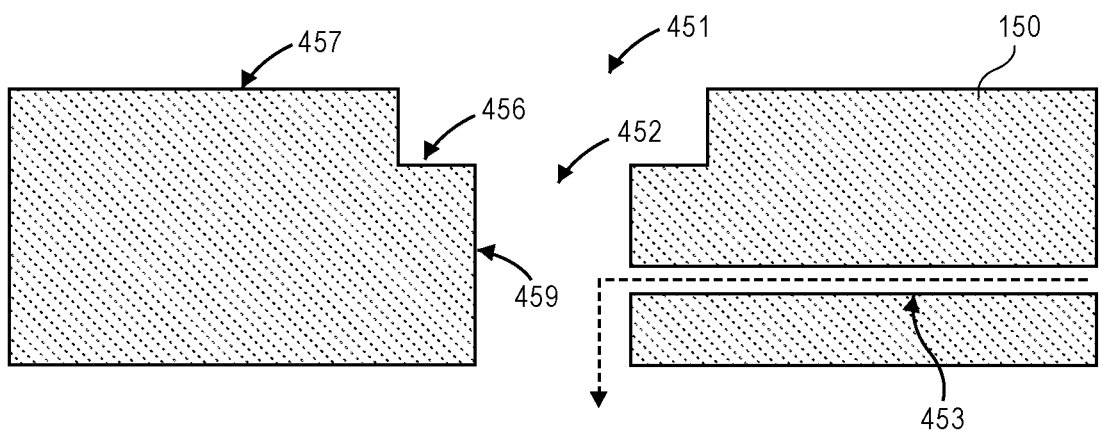
FIG. 4F is a cross-sectional illustration of an applicator frame with an integrated gas distribution system with a single channel intersecting an opening, in accordance with an additional embodiment.

While two channels $453_A$ and $453_B$ are illustrated as intersecting the opening 452 in FIGS. 4B-4E, it is to be appreciated that any number of channels 453 may intersect an opening 452. For example, in FIG. 4F, a cross-sectional illustration of an applicator frame 150 with a single channel 453 intersecting the opening 452 is shown, in accordance with an embodiment. In an embodiment, every opening 452 in an applicator frame 150 may be intersected by at least one channel 453. Additional embodiments may include an applicator frame 150 where not all openings 452 are intersected by a channel 453.

Using the openings 452 as the exit path for gasses flown in the channels 453 decreases the fabrication complexity of the applicator frame. Particularly, since the openings 452 are already needed to couple the applicators 142 to the processing chamber 178, the vertical exit pathways (as indicated by the dashed lines) are already present and only lateral channels need to be fabricated. Therefore, additional vertical channels are not needed for the gas distribution system in some embodiments.

As used herein, a "lateral channel" refers to a channel that runs substantially parallel to a major surface 457 or 458. For example, in a non-planar applicator frame (e.g., domed, cylindrical, etc.), a lateral channel may match the contour of the applicator frame 150. In the particular example of a domed applicator frame, the lateral channel may follow the domed contour and have an arched pathway. In an embodiment, a lateral channel may be substantially the same distance away from one of the major surfaces 457 or 458 over an entire length of the lateral channel. In some embodiments, a lateral channel may refer to a plenum.

Figure 4G:
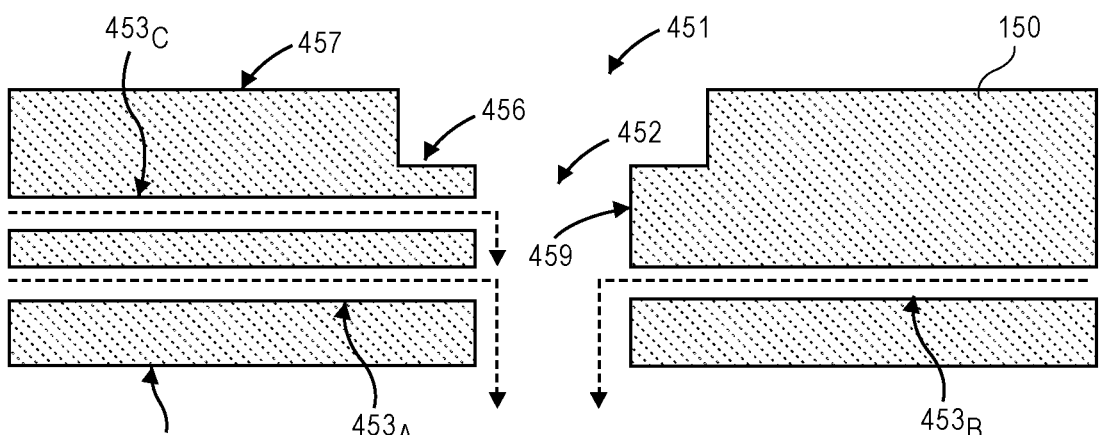
FIG. 4G is a cross-sectional illustration of an applicator frame with an integrated gas distribution system with channels at different z-heights, in accordance with an embodiment.

Referring now to FIG. 4G, a cross-sectional illustration of an applicator frame with 150 with an integrated gas distribution system comprising embedded channels is shown, in accordance with another embodiment. In the illustrated embodiment, the gas distribution system includes a plurality of lateral channels 353 that are formed at more than one z-height in the applicator frame 150. As used herein the z-height refers to the vertical dimension in the figures. For example, a first and second channel $453_A$ and $453_B$ may be formed at a first z-height and a third channel $453_C$ is formed at a second z-height. In an embodiment, one or more channels 453 at a first z-height (e.g., $453_A$ and $453_B$) may intersect the same opening 492 as one or more channels at a second z-height (e.g., $453_C$). Accordingly, channels 453 at different z-heights may share the same exit path from the applicator frame as indicated by the dashed arrows.

Figure 4H:
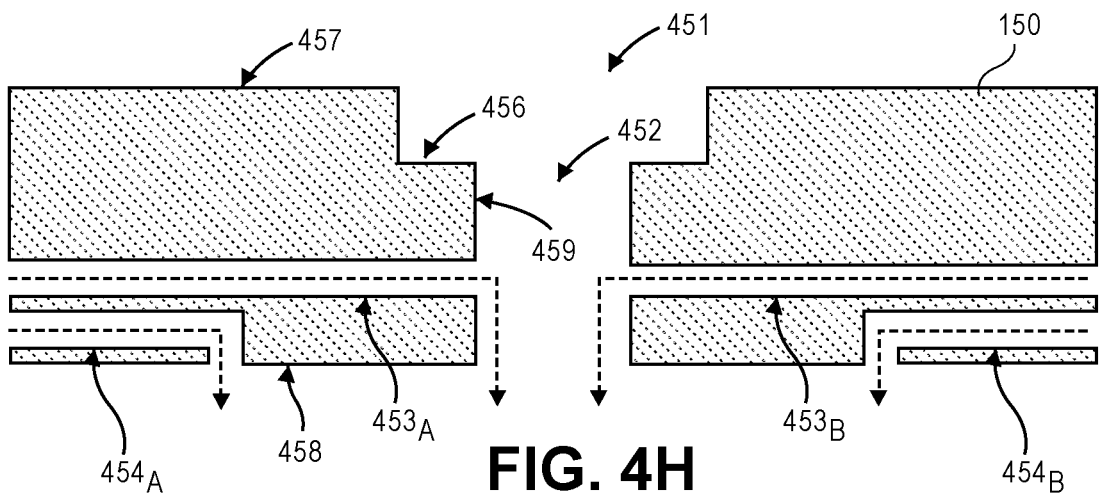
FIG. 4H is a cross-sectional illustration of an applicator frame with an integrated gas distribution system, in accordance with an additional embodiment.

Referring now to FIG. 4H, a cross-sectional illustration of an applicator frame with an integrated gas distribution system comprising embedded channels is shown, in accordance with an additional embodiment. In the illustrated embodiment, the applicator frame includes first channels 353A and 353B that comprise only lateral sections that intersect with the opening 452, and second channels 354A and 354B that include lateral and vertical portions. Such an embodiment may be beneficial if the number and/or location of the openings 452 does not provide sufficient coverage to obtained the desired gas distribution. In the illustrated embodiment, all of the first channels 353 are at the same z-height, and all of the second channels 354 are at the same z-height. However, it is to be appreciated that first channels 353 with only lateral portions and second channels 354 with lateral and vertical portions may be formed at substantially the same z-height in some embodiments.

Figure 5A:
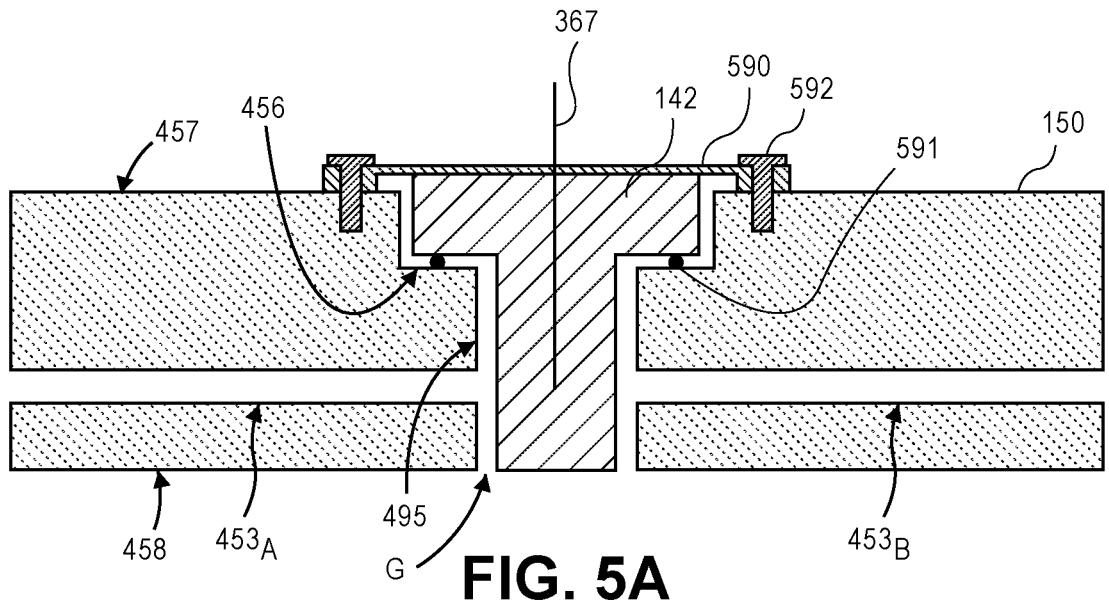
FIG. 5A is a cross-sectional illustration of an applicator positioned in an opening through an applicator frame with an integrate gas distribution system, in accordance with an embodiment.
Figure 5B:
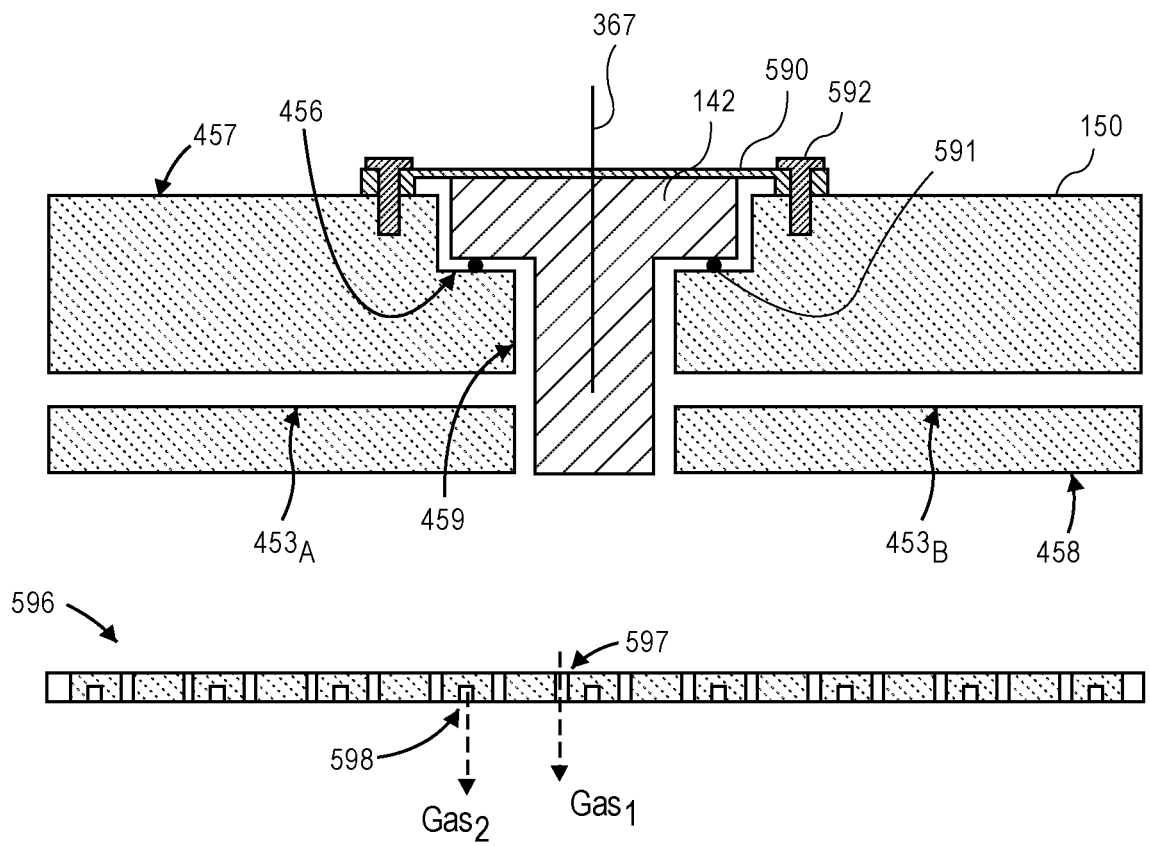
FIG. 5B is a cross-sectional illustration of an applicator positioned in an opening through an applicator frame with an integrated gas distribution system, and further including a gas distribution plate opposing a surface of the applicator frame, in accordance with an embodiment.
Figure 5C:
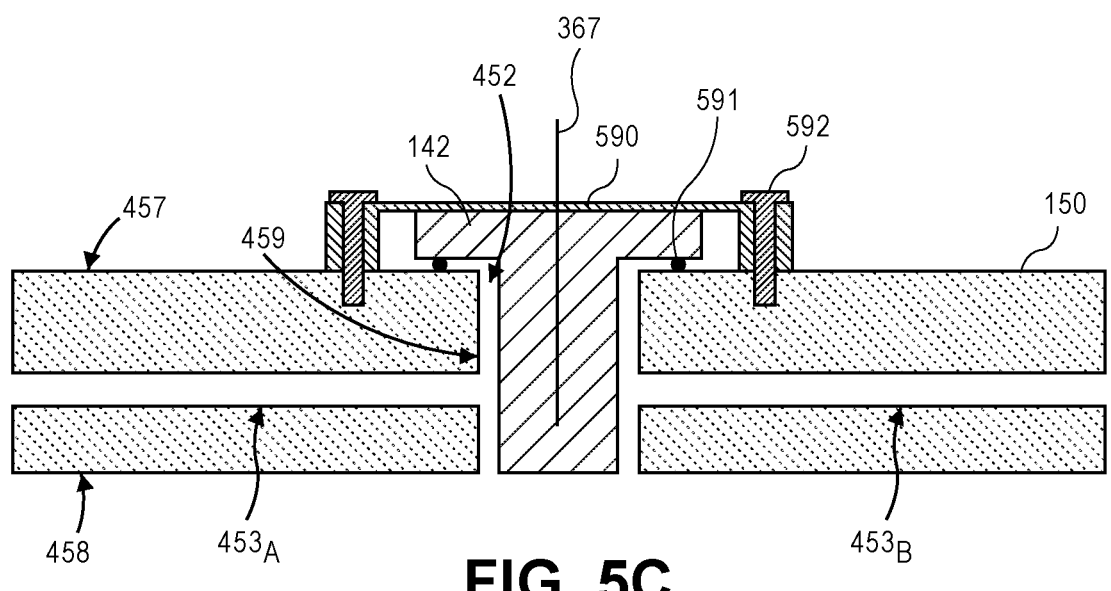
FIG. 5C is a cross-sectional illustration of an applicator positioned in an opening through an applicator frame with an integrated gas distribution system, in accordance with an additional embodiment.

Referring now to FIGS. 5A-5C, cross-sectional illustrations of applicator frames 150 that are supporting applicators 152 is shown, in accordance with an embodiment. In FIG. 5A, an applicator 142 is set into the opening 452. A portion of the applicator 142 is supported by the step surface 456 formed by the recess 451. In an embodiment, the applicator 142 may be separated from the step surface 456 by an O-ring 591, or the like. In an embodiment, the applicator 142 may compress the O-ring 591 as a result of pressure applied to the applicator 142 by mounting hardware. For example, mounting hardware may include a bracket 590 and fasteners (e.g., bolts, pins, etc.) 592. It is to be appreciated that mounting hardware may take any form, and embodiments are not limited by the embodiments illustrated herein. The compressed seal 591 blocks the upper end of the opening 452 and results in gasses flown in the channels $453_A$ and $453_B$ to exit out the bottom end of the opening 452 into the chamber 178.

In an embodiment, a portion of the applicator 142 extends down into the opening 452. A width of at least a portion of the applicator 142 is less than a width of the opening 452. As such, a gap G is formed between the sidewall 459 of the opening and a sidewall of the applicator 142. The gap G may be sufficient to provide the desired flow of gasses from the channels out the bottom of the opening 452. In an embodiment, a bottom surface of the applicator 142 is substantially coplanar with the second major surface 458 of the applicator frame 150. In an embodiment a bottom surface of the applicator 142 extends past the second major surface 158. In an embodiment a bottom surface of the applicator 142 does not exit the opening 452.

Referring now to FIG. 5B, a cross-sectional illustration of an applicator frame 150 that is supporting an applicator 142 and is proximate to a gas distribution plate 596 is shown, in accordance with an embodiment. In an embodiment, a gas distribution plate 596 may be spaced away from the second major surface 458. In an embodiment, the space between the gas distribution plate 596 and the second major surface 458 may be sufficient to form a plasma between the two components.

In an embodiment, the gas distribution plate may have openings 597 that pass completely through the gas distribution plate to allow gasses to flow from the second major surface 458 and through the gas distribution plate 596 as indicated by the first dashed arrow. In an embodiment, the gas distribution plate 596 may also include an internal gas distribution network in order to inject a second gas into the processing volume. For example, gas distribution plate 596 may include a plurality of outlets 598 to allow a second gas that is flown in plenums within the gas distribution plate to be injected into the processing volume, as indicated by the second dashed arrow. In an embodiment, the gas distribution plate 596 may comprises any number of channels and/or inlets and outlets. The use of a gas distribution plate exterior to the applicator frame may provide additional flexibility in the control of the flow of gasses into the chamber 178.

Referring now to FIG. 5C, a cross-sectional illustration of an applicator frame 150 that is supporting an applicator is shown, in accordance with an additional embodiment. In the illustrated embodiment, the applicator frame 150 comprises an opening 452 without a recess. In such embodiments, a portion of the applicator 142 may be supported by the first major surface 457 of the applicator frame 150. For example, the seal ring 591 may be in direct contact with the first major surface 457. It is to be appreciated that embodiments are not limited to any configuration of supporting the applicator 142. Embodiments include all configurations where channels intersect an opening through the applicator frame 150 where one end of the opening is sealed, at least in part, by the applicator 142.

Figure 6A:
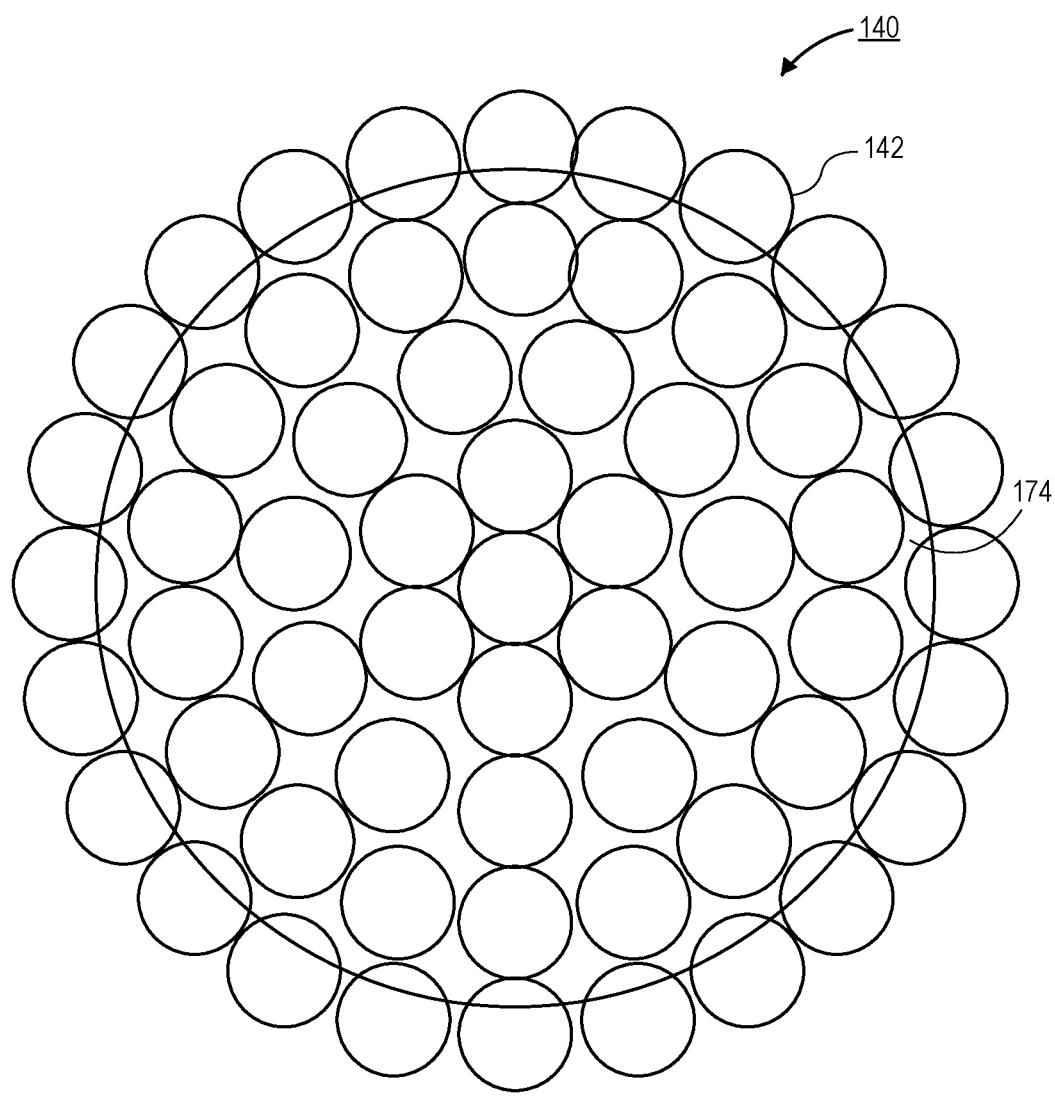
FIG. 6A is a plan view of an array of applicators that may be used to couple high-frequency radiation to a processing chamber, in accordance with an embodiment.

In FIG. 6A, the applicators 142 in the array 140 are packed together in a series of concentric rings that extend out from the center of the substrate 174. However, embodiments are not limited to such configurations, and any suitable spacing and/or pattern may be used depending on the needs of the processing tool 100. Furthermore, embodiments allow for applicators 142 with any symmetrical cross-section, as described above. Accordingly, the cross-sectional shape chosen for the applicator may be chosen to provide enhanced packing efficiency.

Figure 6B:
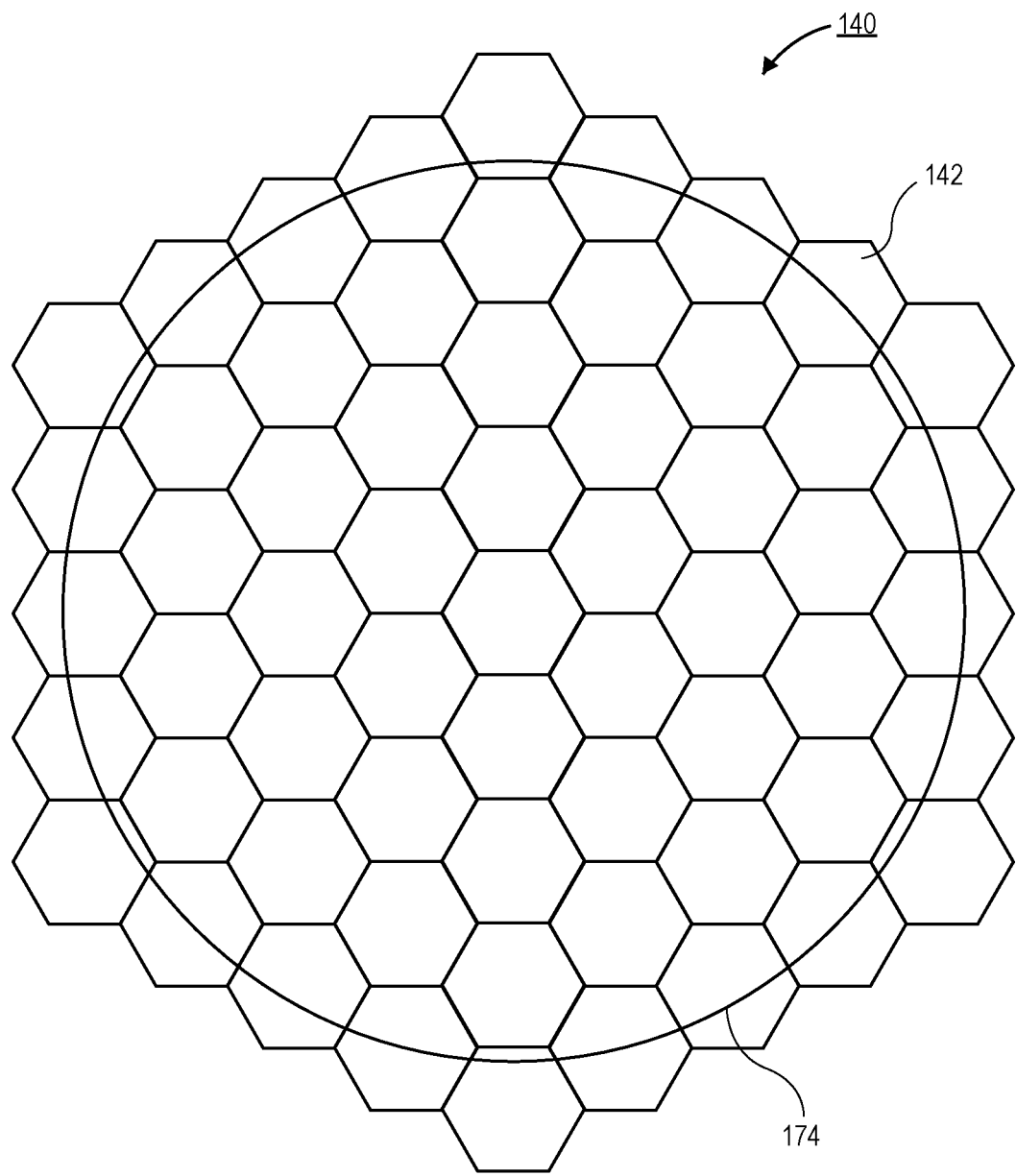
FIG. 6B is a plan view of an array of applicators that may be used to couple high-frequency radiation to a processing chamber, in accordance with an additional embodiment.

Referring now to FIG. 6B, a plan view of an array 140 of applicators 142 with a non-circular cross-section is shown, according to an embodiment. The illustrated embodiment includes applicators 142 that have hexagonal cross-sections. The use of such an applicator may allow for improved packing efficiency because the perimeter of each applicator 142 may mate nearly perfectly with neighboring applicators 142. Accordingly, the uniformity of the plasma may be enhanced even further since the spacing between each of the applicators 142 may be minimized. While FIG. 4B illustrates neighboring applicators 142 sharing sidewall surfaces, it is to be appreciated that embodiments may also include non-circular symmetrically shaped applicators that include spacing between neighboring applicators 142.

Figure 6C:
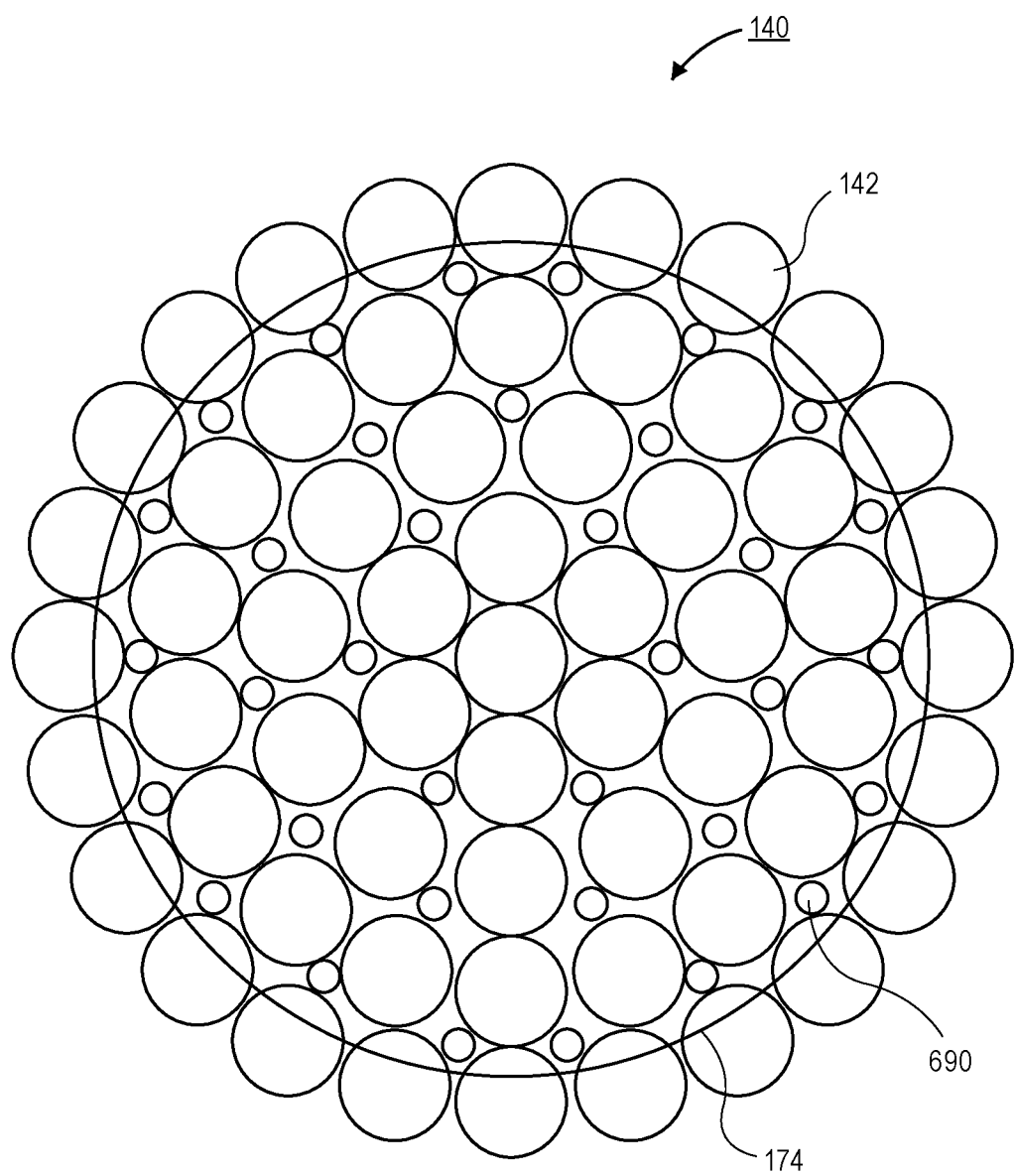
FIG. 6C is a plan view of an array of applicators and a plurality of sensors for detecting conditions of a plasma, in accordance with an embodiment.

Referring now to FIG. 6C, an additional plan-view illustration of an array 140 of applicators 142 is shown according to an embodiment. The array 140 in FIG. 4C is substantially similar to the array 140 described above with respect to FIG. 4A, except that a plurality of sensors 690 are also included. The plurality of sensors provides improved process monitoring capabilities that may be used to provide additional feedback control of each of the modular high-frequency sources 105. In an embodiment, the sensors 690 may include one or more different sensor types 690, such as plasma density sensors, plasma emission sensors, radiation field density sensors, radiation emission sensors, or the like. Positioning the sensors across the surface of the substrate 174 allows for the radiation field and/or plasma properties at given locations of the processing chamber 100 to be monitored.

According to an embodiment, every applicator 142 may be paired with a different sensor 690. In such embodiments, the output from each sensor 690 may be used to provide feedback control for the respective applicator 142 to which the sensor 690 has been paired. Additional embodiments may include pairing each sensor 690 with a plurality of applicators 142. For example, each sensor 690 may provide feedback control for multiple applicators 142 to which the sensor 690 is proximately located. In yet another embodiment, feedback from the plurality of sensors 690 may be used as a part of a multi-input multi-output (MIMO) control system. In such an embodiment, each applicator 142 may be adjusted based on feedback from multiple sensors 690. For example, a first sensor 690 that is a direct neighbor to a first applicator 142 may be weighted to provide a control effort to the first applicator 142 that is greater than the control effort exerted on the first applicator 142 by a second sensor 690 that is located further from the first applicator 142 than the first sensor 690.

Figure 6D:
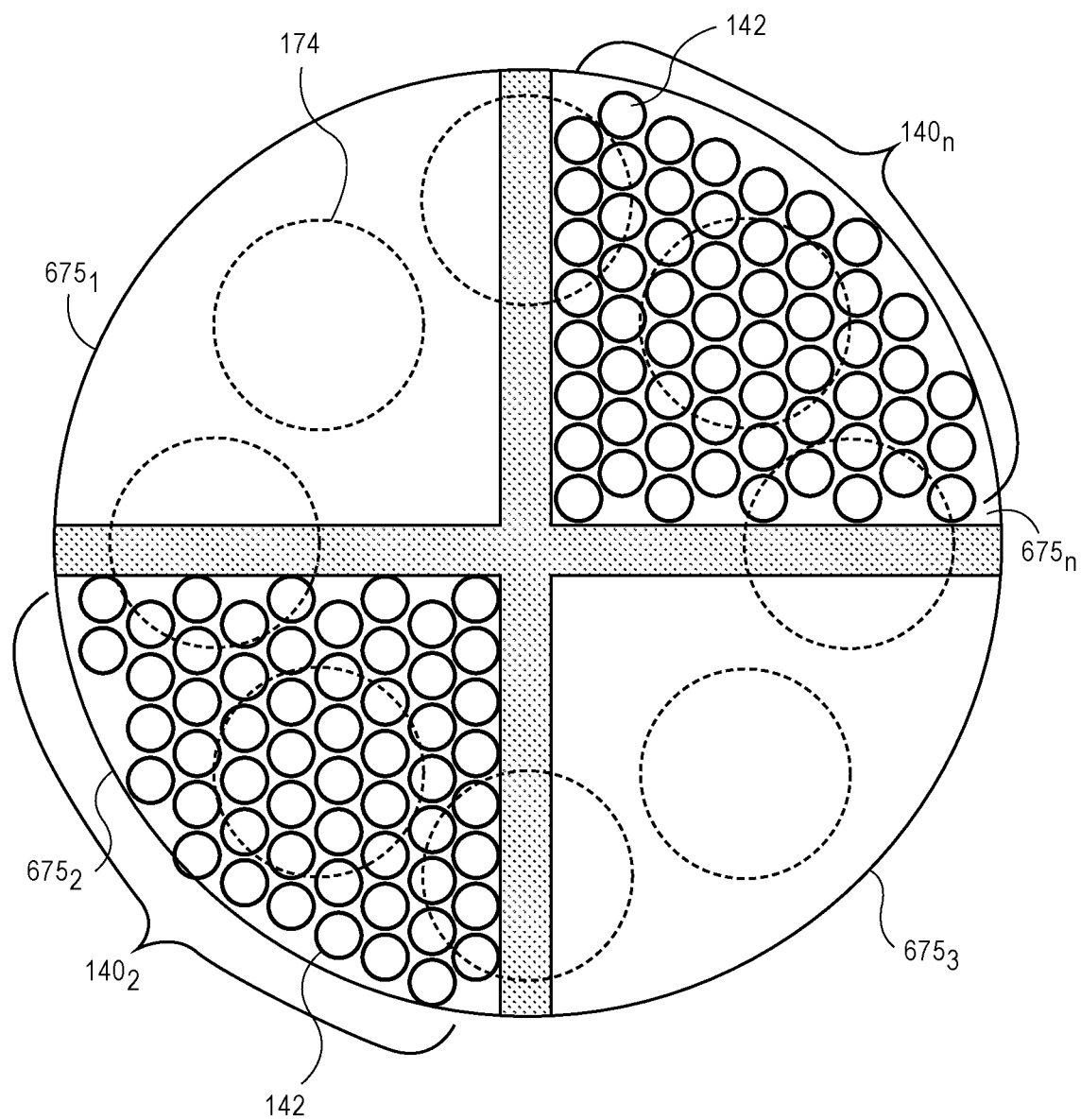
FIG. 6D is a plan view of an array of applicators that are formed in two zones of a multi-zone processing tool, in accordance with an embodiment.

Referring now to FIG. 6D, an additional plan-view illustration of an array 140 of applicators 142 positioned in a multi-zone processing tool 100 is shown, according to an embodiment. In an embodiment, the multi-zone processing tool 100 may include any number of zones. For example, the illustrated embodiment includes zones $675_1$-$675_n$. Each zone 675 may be configured to perform different processing operations on substrates 174 that are rotated through the different zones 675. As illustrated, a first array $140_2$ is positioned in zone $675_2$ and a second array $140_n$ is positioned in zone $675_n$. However, embodiments may include multi-zone processing tools 100 with an array 140 of applicators 142 in one or more of the different zones 675, depending on the needs of the device. The spatially tunable density of the plasma and/or radiation field provided by embodiments allows for the accommodation of nonuniform radial velocity of the rotating substrates 174 as they pass through the different zones 675.

In an embodiment, the ratio of oscillator modules 106 to applicators 142 may be 1:1 (i.e., every applicator 142 is coupled to a different oscillator module 106). In additional embodiments, the ratio of oscillator modules 106 to applicators 142 may be 1:2, 1:3, 1:4, etc. For example, in embodiments that include two arrays of applicators $140_2$ and $140_n$, each oscillator module 106 may be coupled to a first applicator 142 in the first array $140_2$ and to a second applicator 142 in the second array $140_n$.

Figure 7:
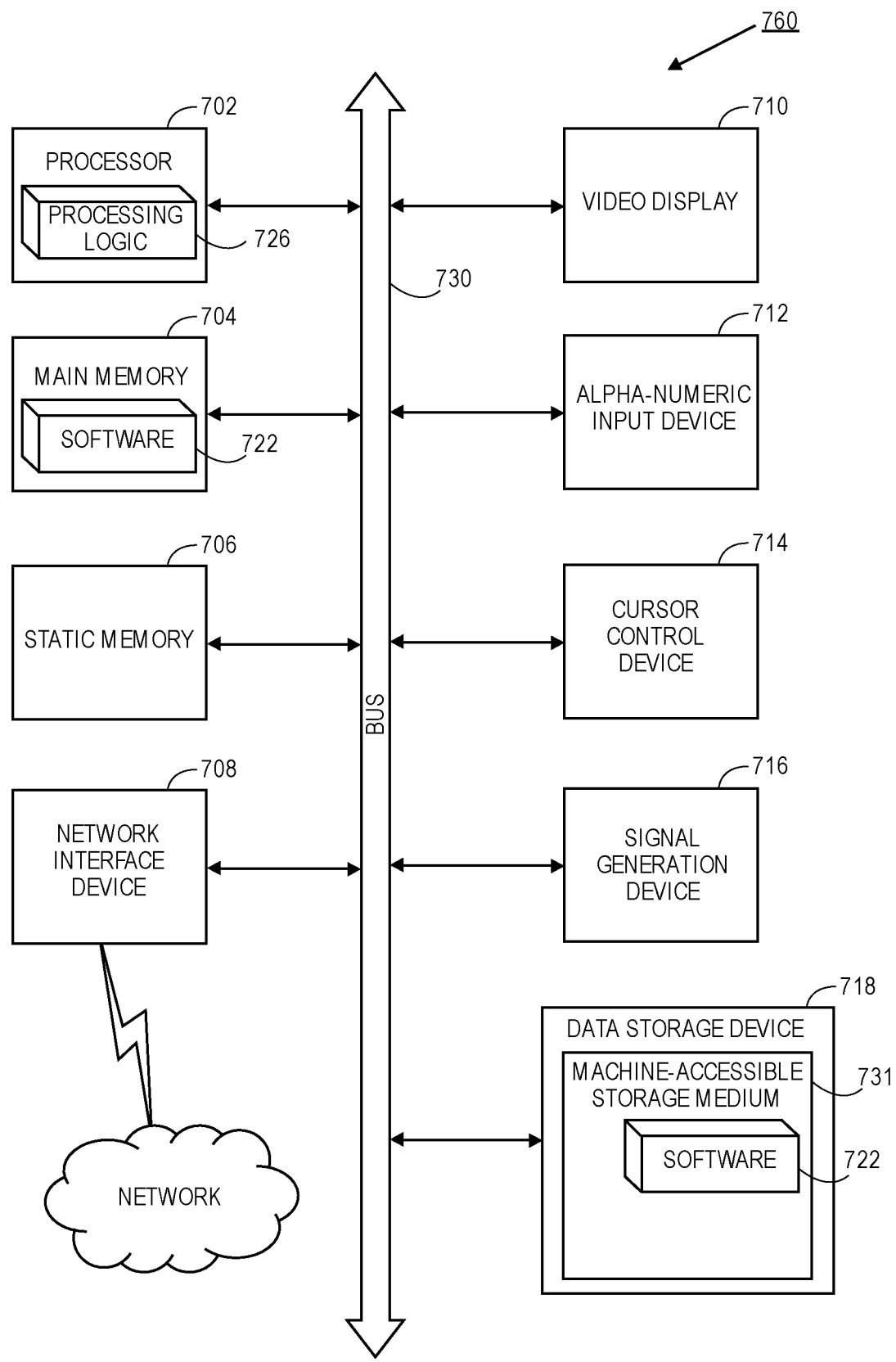
FIG. 7 illustrates a block diagram of an exemplary computer system that may be used in conjunction with a modular high-frequency radiation source, in accordance with an embodiment.

Referring now to FIG. 7, a block diagram of an exemplary computer system 760 of a processing tool 100 is illustrated in accordance with an embodiment. In an embodiment, computer system 760 is coupled to and controls processing in the processing tool 100. Computer system 760 may be connected (e.g., networked) to other machines in a Local Area Network (LAN), an intranet, an extranet, or the Internet. Computer system 760 may operate in the capacity of a server or a client machine in a client-server network environment, or as a peer machine in a peer-to-peer (or distributed) network environment. Computer system 760 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 760, the term "machine" shall also be taken to include any collection of machines (e.g., computers) that individually or jointly execute a set (or multiple sets) of instructions to perform any one or more of the methodologies described herein.

Computer system 760 may include a computer program product, or software 722, having a non-transitory machine-readable medium having stored thereon instructions, which may be used to program computer system 760 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 760 includes a system processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

System processor 702 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 702 may also be one or more special-purpose processing devices such as an application specific integrated circuit (ASIC), a field programmable gate array (FPGA), a digital signal system processor (DSP), network system processor, or the like. System processor 702 is configured to execute the processing logic 726 for performing the operations described herein.

The computer system 760 may further include a system network interface device 708 for communicating with other devices or machines. The computer system 760 may also include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium 731 (or more specifically a computer-readable storage medium) on which is stored one or more sets of instructions (e.g., software 722) embodying any one or more of the methodologies or functions described herein. The software 722 may also reside, completely or at least partially, within the main memory 704 and/or within the system processor 702 during execution thereof by the computer system 760, the main memory 704 and the system processor 702 also constituting machine-readable storage media. The software 722 may further be transmitted or received over a network 720 via the system network interface device 708.

While the machine-accessible storage medium 731 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A processing tool comprising:
   a processing chamber;
   a chuck for supporting a substrate in the processing chamber;
   an applicator frame forming a portion of the processing chamber, wherein the applicator frame comprises:
      a first major surface;
      a second major surface opposite the first major surface;
      a plurality of through holes, wherein the through holes extend entirely through the applicator frame; and
      a plurality of lateral channels embedded in the applicator frame, wherein one or more of the lateral channels intersect at least one of the through holes; and
   a modular high-frequency emission source, comprising:
      a plurality of high-frequency emission modules, wherein each high-frequency emission module comprises:
         an oscillator module;
         an amplification module, wherein the amplification module is coupled to the oscillator module; and
         an applicator, wherein the applicator is coupled to the amplification module, and wherein the applicator seals one end of one of the through holes in the applicator frame.

2. The processing tool of claim 1, wherein each of the applicators seal one of the openings through the applicator frame by compressing a sealing ring.

3. The processing tool of claim 2, wherein the applicator frame further comprises:
   a plurality of recesses, wherein each recess is substantially concentric with one of the openings, and wherein the seal ring rests on a step surface defined by one of the recesses.

4. The processing tool of claim 1, wherein the plurality of lateral channels are fluidically coupled to one or more gas sources.

5. The processing tool of claim 1, wherein the applicator frame is a sidewall of the processing chamber or a lid of the processing chamber.

6. The processing tool of claim 1, wherein the applicator frame comprises an electrically grounded layer.

7. The processing tool of claim 1, further comprising a gas distribution plate proximate to the second major surface of the applicator frame.

8. A gas distribution assembly, comprising:
   an applicator frame, wherein the applicator frame comprises:
      a first major surface;
      a second major surface opposite the first major surface;
      a plurality of through holes, wherein the through holes extend entirely through the applicator frame; and
      a plurality of lateral channels embedded in the applicator frame, wherein the lateral channels intersect at least one of the through holes; and
   a plurality of applicators, wherein each applicator seals a first end of one of the plurality of through holes.

9. The gas distribution assembly of claim 8, wherein each of the applicators seal one of the openings through the applicator frame by compressing a sealing ring.

10. The gas distribution assembly of claim 9, wherein the applicator frame further comprises:
   a plurality of recesses, wherein each recess is substantially concentric with one of the openings, and wherein the seal ring rests on a step surface defined by one of the recesses.

* * * * *